US010355415B2

(12) United States Patent
Kim et al.

(10) Patent No.: US 10,355,415 B2
(45) Date of Patent: Jul. 16, 2019

(54) PCB INCLUDING CONNECTOR AND GROUNDS WITH DIFFERENT POTENTIALS, AND ELECTRONIC DEVICE HAVING THE SAME

(71) Applicant: SAMSUNG ELECTRONICS CO., LTD., Suwon-si, Gyeonggi-do (KR)

(72) Inventors: Hyung Joon Kim, Suwon-si (KR); Min-Seok Kim, Seoul (KR); Sigwan Kim, Suwon-si (KR); Jung-Woo Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/916,505

(22) Filed: Mar. 9, 2018

(65) Prior Publication Data

US 2018/0287302 A1    Oct. 4, 2018

(30) Foreign Application Priority Data

Mar. 28, 2017   (KR) ........................ 10-2017-0039201

(51) Int. Cl.
*H01R 13/648* (2006.01)
*H05K 1/02* (2006.01)
(Continued)

(52) U.S. Cl.
CPC ....... *H01R 13/6471* (2013.01); *H01R 12/721* (2013.01); *H01R 13/6466* (2013.01);
(Continued)

(58) Field of Classification Search
CPC .. H01R 13/647; H01R 12/716; H05K 1/0215; H05K 1/0298; H05K 2201/095; H05K 2201/0715
See application file for complete search history.

(56) References Cited

U.S. PATENT DOCUMENTS 7,338,290 B2 *  3/2008  Motohashi ............. H05K 1/117
                                                     439/55
2003/0123238 A1   7/2003  Yu et al.
(Continued)

FOREIGN PATENT DOCUMENTS

JP        2006-286894       10/2006

OTHER PUBLICATIONS

Search Report and Written Opinion dated Jun. 27, 2018 in counterpart International Patent Application No. PCT/KR2018/002914.
(Continued)

*Primary Examiner* — Xuong M Chung Trans
(74) *Attorney, Agent, or Firm* — Nixon & Vanderhye P.C.

(57) ABSTRACT

An electronic device according to an example embodiment includes: a substrate; and a connector including a plurality of terminals disposed on a first area of the substrate, wherein the substrate includes: a first layer including signal lines connected to the plurality of terminals and a dielectric material disposed between the signal lines; a second layer disposed on the first layer, and including a first ground electrically connected with the connector and a second ground physically isolated from the first ground; a third conductive layer disposed on the second layer, and electrically connected with the second ground; and a fourth layer having a nonconductive material disposed on an area corresponding to the first area between the second layer and the third conductive layer.

20 Claims, 23 Drawing Sheets

(51) Int. Cl.
*H01R 13/6471* (2011.01)
*H01R 13/6466* (2011.01)
*H01R 13/66* (2006.01)
*H01R 12/72* (2011.01)

(52) U.S. Cl.
CPC ....... *H01R 13/6691* (2013.01); *H05K 1/0215* (2013.01); *H05K 1/0218* (2013.01); *H05K 1/0298* (2013.01); *H01R 2201/16* (2013.01); *H05K 2201/0715* (2013.01); *H05K 2201/095* (2013.01); *H05K 2201/10189* (2013.01)

(56) References Cited

U.S. PATENT DOCUMENTS

| | | | |
|---|---|---|---|
| 2005/0225955 A1* | 10/2005 | Grebenkemper | H05K 1/0218 361/780 |
| 2009/0219239 A1* | 9/2009 | Lee | G09G 3/2092 345/87 |
| 2009/0275235 A1 | 11/2009 | Shi et al. | |
| 2010/0091439 A1* | 4/2010 | Horii | H04M 1/0249 361/679.01 |
| 2010/0277377 A1* | 11/2010 | Sato | H01Q 1/243 343/702 |
| 2011/0222247 A1* | 9/2011 | Motohashi | H05K 1/0227 361/748 |
| 2015/0171562 A1 | 6/2015 | Gao et al. | |
| 2016/0344120 A1 | 11/2016 | Hong et al. | |

OTHER PUBLICATIONS

Universal Serial Bus 3.0 Specification, Revision 1.0, Hewlett-Packard Company, Nov. 12, 2008, 482 pages.
Universal Serial Bus 3.1 Specification, Revision 1.0, Hewlett-Packard Company, Jul. 26, 2013, 631 pages.

* cited by examiner

| A1 | A2 | A3 | A4 | A5 | A6 | A7 | A8 | A9 | A10 | A11 | A12 |
|----|----|----|----|----|----|----|----|----|-----|-----|-----|
| GND | TX1+ | TX1- | VBUS | CC1 | D+ | D- | SBU1 | VBUS | RX2- | RX2+ | GND |

| GND | RX1+ | RX1- | VBUS | SBU2 | D- | D+ | CC2 | VBUS | TX2- | TX2+ | GND |
|-----|------|------|------|------|----|----|-----|------|------|------|-----|
| B12 | B11 | B10 | B9 | B8 | B7 | B6 | B5 | B4 | B3 | B2 | B1 |

FIG.6B

| Cases | First band (1801) | Second band (1802) |
|---|---|---|
| When wired communication is not performed with an external device through an external port | - 94.7 dBm | - 95.4 dBm |
| When wired communication is performed with an external device through an external port | - 88.9 dBm | - 91.1 dBm |
| Delta | - 5.8 | - 4.3 dBm |

FIG.18A

| Cases | First band (1801) | Second band (1802) |
|---|---|---|
| When wired communication is not performed with an external device through an external port | - 94.1 dBm | - 96.1 dBm |
| When wired communication is performed with an external device through an external port | - 80.8 dBm | - 88.3 dBm |
| Delta | - 13.2 | - 7.8 dBm |

FIG.18B

PCB INCLUDING CONNECTOR AND GROUNDS WITH DIFFERENT POTENTIALS, AND ELECTRONIC DEVICE HAVING THE SAME

CROSS-REFERENCE TO RELATED APPLICATION

This application is based on and claims priority under 35 U.S.C. § 119 to an application filed in the Korean Intellectual Property Office on Mar. 28, 2017 and assigned Serial No. 10-2017-0039201, the disclosure of which is incorporated by reference herein in its entirety.

BACKGROUND

1. Technical Field

The present disclosure relates to a printed circuit board (PCB) including a connector and grounds with different potentials, and an electronic device having the same.

2. Description of Related Art

With the development of digital technology, electronic devices are provided in various forms such as smart phones, tablet personal computers (PCs), personal digital assistants (PDAs), etc. Electronic devices are developing into forms wearable by users so as to enhance portability and users' accessibility.

Electronic devices may include a plurality of signal lines. For example, an electronic device may include a PCB and various electronic components mounted thereon, and the electronic components may transmit or receive signals or data via signal lines included in the PCB. Electronic devices may include signal lines for electrically connecting PCBs and various electronic components.

An electronic device may include a connector mounted on a PCB. An external device may be electrically connected to the connector (for example, an external port), and the electronic device may exchange signals or data with the external device via the connector. When signals or data are transmitted or received via the connector, an electric field may be generated in the connector due to a flow of a current, and this electric field may cause electro magnetic interference (EMI) (for example, a noise) on an area (or a signal line or an electronic component) adjacent to the connector. The EMI caused by the connector may interrupt normal operations of the electronic device (for example, degraded performance of wireless communication). The PCB may include a ground having the same potential as that of the connector, and a noise occurring in the connector may be reduced by the ground. However, when signals or data are exchanged with an external device via a connector supporting high-speed data transmission or high operating frequency (for example, a USB 3.0 connector or a USB 3.1 connector, or a connector of a higher version), a relatively high noise floor (for example, a measurement value regarding a sum of noises) may be detected in comparison to a connector supporting low-speed data transmission or low operating frequency. It may be difficult to reduce the high noise floor occurring in the connector supporting high-speed data transmission or high operating frequency by using the ground having the same potential as that of the connector.

SUMMARY

Example embodiments of the present disclosure address at least the above-mentioned problems and/or disadvantages and provide at least the advantages described below. Accordingly, an aspect of the present disclosure provides a PCB including a connector and grounds with different potentials, which distributes a noise occurring in the connector when signals or data are exchanged with an external device via the connector, and an electronic device having the same.

Another aspect of the present disclosure provides a PCB including a connector and grounds with different potentials, which can prevent and/or reduce wireless communication performance from being degraded when signals or data are exchanged with an external device via the connector, and an electronic device having the same.

According to an aspect of the present disclosure, an electronic device includes: a substrate; and a connector including a plurality of terminals disposed on a first area of the substrate, wherein the substrate includes: a first layer including signal lines connected to the plurality of terminals and a dielectric material between the signal lines; a second layer disposed on the first layer, and including a first ground electrically connected with the connector and a second ground physically isolated from the first ground; a third conductive layer disposed on the second layer, and electrically connected with the second ground; and a fourth layer having a nonconductive material disposed on an area corresponding to the first area between the second layer and the third conductive layer.

According to an example embodiment, a printed circuit board (PCB) may include a first ground having a same potential as that of a connector, and a second ground having a different potential from that of the first ground and physically isolated from the first ground. According to various example embodiments, the second ground may be electrically connected with another conductive portion (for example, a portion of a housing) of the electronic device, and the ground may be extended. When signals or data are exchanged with an external device via the connector, a noise occurring in the connector may be distributed to the first ground, the second ground, or another conductive portion electrically connected with the second ground, and thus may be reduced. This can enhance an electric influence by the connector. For example, a relatively high noise floor from among noises occurring in the connector may be reduced by the second ground or another conductive portion electrically connected with the second ground.

BRIEF DESCRIPTION OF THE DRAWINGS

The above and/or other aspects, features and attendant advantages of the present disclosure will become more apparent from the following detailed description, taken in conjunction with the accompanying drawings, in which like reference numerals represent like elements, and wherein:

FIGS. 5A and 5B and FIGS. 6A and 6B are diagrams illustrating a connector according to an example embodiment;

FIG. 18A is a table illustrating values regarding communication performance of an electronic device including a substrate having grounds with different potentials according to an example embodiment; and FIG. 18B is a table illustrating values regarding communication performance of an electronic device including a substrate that does not have grounds with different potentials.

DETAILED DESCRIPTION

Figure 1:
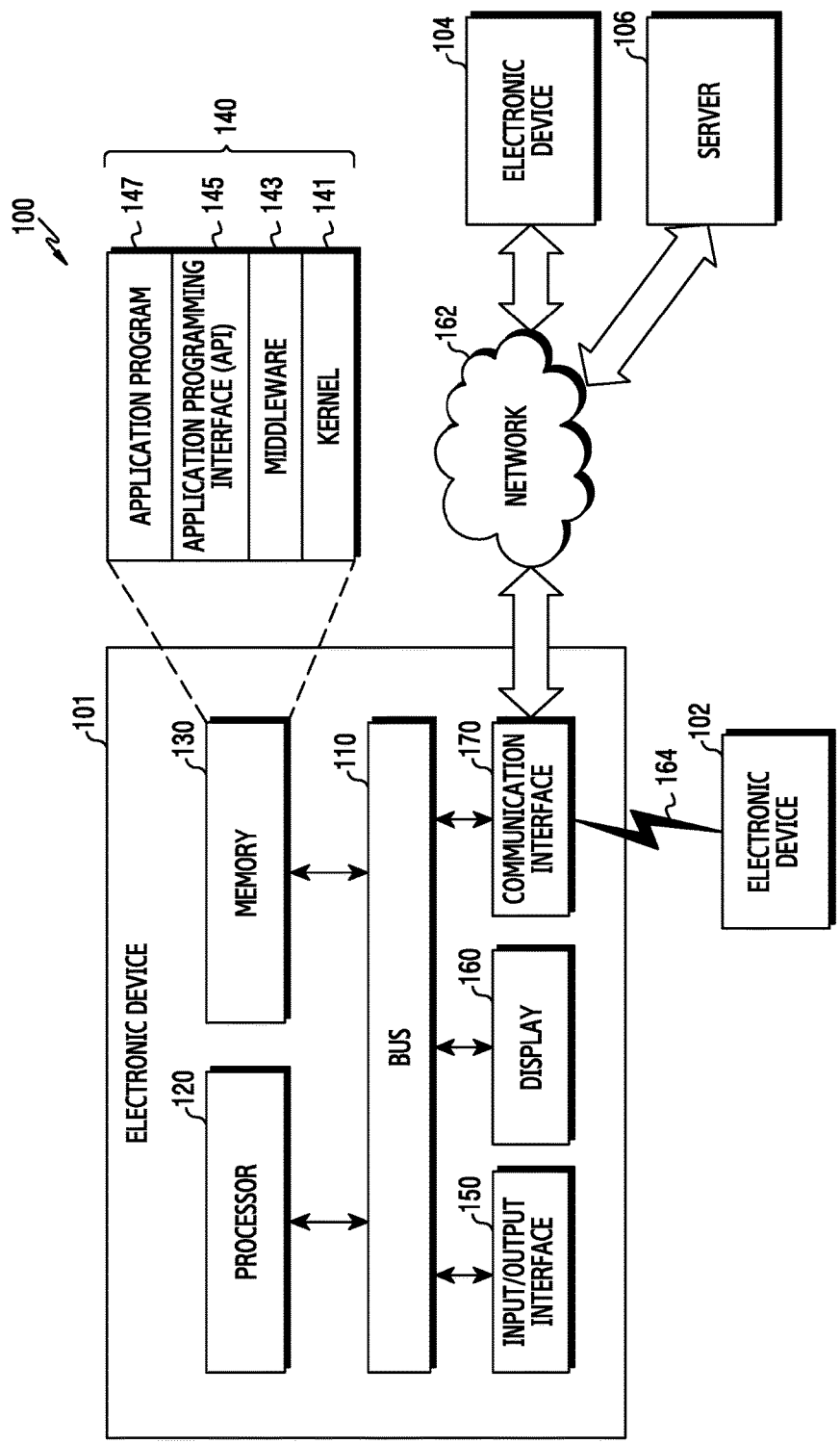
FIG. 1 is a block diagram illustrating an example electronic device in a network environment system according to an example embodiment.

Various example embodiments of the present disclosure will be described herein below with reference to the accompanying drawings. However, example embodiments and terms used herein are not intended to limit the technical features described in the present disclosure to specific embodiments, and should be understood as including modifications, equivalents and/or alternatives of example embodiments of the present disclosure. In the explanation of the drawings, similar reference numerals are used for similar elements. The terms of a singular form may include plural forms unless otherwise specified. The terms "A or B" or "at least one of A and/or B" used in the present disclosure include any and all combinations of the associated listed items. The terms such as "first" and "second" may be used to modify various elements regardless of the order or importance of the elements, and do not limit the modified elements in any way. These terms are used to distinguish one element from another. It will be understood that, when an element (for example, a first element) is mentioned as being "operatively or communicatively coupled with/to" or "connected to" another element (for example, a second element), the element may be directly coupled or connected to another element, or there may be an intervening element (for example, a third element) between the element and another element.

The term "configured (or set) to . . . " used in the present disclosure may be interchangeably used with the terms "suitable for . . . ," "having the capacity to . . . ," "adapted to . . . ," "made to . . . ," "capable of . . . ," or "designed to" in a hardware or software level depending on the situation. In a certain situation, the term "a device configured to . . . " may refer to "the device being capable of . . . " with another device or parts. For example, "a processor configured (set) to perform A, B, and C" may refer to, for example, and without limitation, to a dedicated processor (for example, an embedded processor) for performing a corresponding operation, or a generic-purpose processor (for example, a central processing unit (CPU) or an application processor (AP)), or the like, for performing corresponding operations by executing one or more software programs stored in a memory device.

An electronic device according to various embodiments of the present disclosure may include at least one of smartphones, tablet personal computers (PCs), mobile phones, video telephones, electronic book readers, desktop PCs, laptop PCs, netbook computers, workstations, servers, PDAs, portable multimedia players (PMPs), Motion Picture Experts Group (MPEG-1 or MPEG-2) Audio Layer 3 (MP3) players, medical devices, cameras, or wearable devices, or the like, but is not limited thereto. The wearable devices may include at least one of accessories (for example, watches, rings, bracelets, ankle bracelets, necklaces, glasses, contact lenses, head-mounted-devices (HMDs), etc.), fabric- or clothing-mounted devices (for example, electronic apparels), body-mounted devices (for example, skin pads, tattoos, etc.), bio-implantable circuits, or the like, but are not limited thereto. According to embodiments, the electronic devices may include at least one of, for example, televisions (TVs), digital video disk (DVD) players, audios, refrigerators, air conditioners, cleaners, ovens, microwave ovens, washing machines, air cleaners, set-top boxes, home automation control panels, security control panels, media boxes (for example, Samsung HomeSync™, Apple TV™, or Google TV™), game consoles (for example, Xbox™ and PlayStation™), electronic dictionaries, electronic keys, camcorders, electronic picture frames, or the like, but are not limited thereto.

According to another embodiment, the electronic devices may include at least one of medical devices (for example, various portable medical measurement devices (for example, a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, global navigation satellite systems (GNSS), event data recorders (EDRs), flight data recorders (FDRs), vehicle infotainment devices, electronic equipment for vessels (for example, navigation systems and gyrocompasses), avionics, security devices, head units for vehicles, industrial or home robots, automatic teller's machines (ATMs) of financial institutions, points of sales (POSs) of stores, or internet of things (for example, light bulbs, various sensors, sprinkler devices, fire alarms, thermostats, street lamps, toasters, exercise equipment, hot water tanks, heaters, boilers, and the like), or the like, but are not limited thereto. According to an example embodiment, the electronic devices may include at least one of furniture, a part of buildings/structures or cars, electronic boards, electronic signature receiving devices, projectors, or various measuring instruments (for example, water meters, electricity meters, gas meters, or wave meters, and the like), or the like, but are not limited thereto. The electronic devices according to various embodiments may be flexible or may be a combination of two or more devices of the above-mentioned devices. Also, electronic devices according to various embodiments of the present disclosure are not limited to the above-mentioned devices. In the present disclosure, the term "user" may refer to a person who uses the electronic device or a device that uses the electronic device (for example, an artificial intelligence electronic device).

FIG. 1 is a block diagram illustrating an example electronic device in a network environment system according to an example embodiment. Referring to FIG. 1, there is illustrated an electronic device 101 in a network environment 100 according to various example embodiments. The electronic device 101 may include a bus 110, a processor 120, a memory 130, an input/output interface 150, a display 160, and a communication interface 170. According to an example embodiment, the electronic device 101 may not include at least one of the above-described elements or may further include other element(s).

The bus 110 may interconnect the above-described elements 120-170 and may include a circuit for transmitting communications (for example, a control message or data) among the above-described elements.

The processor 120 may include various processing circuitry, such as, for example, and without limitation, one or more of a dedicated processor, a central processing unit (CPU), an application processor (AP), or a communication processor (CP), or the like. The processor 120 may perform, for example, an operation or data processing associated with control and/or communication of at least one other element(s) of the electronic device 101.

The memory 130 may include a volatile memory and/or nonvolatile memory. The memory 130 may store commands or data associated with at least one other element(s) of the electronic device 101. According to an example embodiment, the memory 130 may store software and/or a program 140. The program 140 may include, for example, a kernel 141, a middleware 143, an application programming interface (API) 145, and/or an application program (or an application) 147. At least a portion of the kernel 141, the middleware 143, or the API 145 may be called an "operating system (OS)." The kernel 141 may control or manage system resources (for example, the bus 110, the processor 120, the memory 130, and the like) that are used to execute operations or functions of other programs (for example, the middleware 143, the API 145, or the application program 147). Furthermore, the kernel 141 may provide an interface that allows the middleware 143, the API 145, or the application program 147 to access discrete elements of the electronic device 101 so as to control or manage system resources.

The middleware 143 may perform a mediation role such that the API 145 or the application program 147 communicates with the kernel 141 to exchange data. Furthermore, the middleware 143 may process one or more task requests received from the application program 147 according to a priority. For example, the middleware 143 may assign the priority, which makes it possible to use a system resource (for example, the bus 110, the processor 120, the memory 130, or the like) of the electronic device 101, to at least one of the application program 147, and may process the one or more task requests. The API 145 may be an interface through which the application 147 controls a function provided by the kernel 141 or the middleware 143, and may include, for example, at least one interface or function (for example, an instruction) for a file control, a window control, image processing, a character control, or the like.

The input/output interface 150 may include various input/output circuitry and transmit a command or data, input from a user or another external device, to other element(s) of the electronic device 101. Furthermore, the input/output interface 150 may output a command or data, received from other element(s) of the electronic device 101, to a user or another external device.

The display 160 may include, for example, a liquid crystal display (LCD), a light-emitting diode (LED) display, an organic LED (OLED) display, a microelectromechanical systems (MEMS) display, or an electronic paper display, or the like, but is not limited thereto. The display 160 may display, for example, various contents (for example, a text, an image, a video, an icon, and/or a symbol) to a user. The display 160 may include a touch screen and may receive, for example, a touch, gesture, proximity, or hovering input using an electronic pen or a portion of a user's body.

The communication interface 170 may include various communication circuitry and establish communication between the electronic device 101 and an external device (for example, a first external electronic device 102, a second external electronic device 104, or a server 106). For example, the communication interface 170 may be connected to a network 162 through wireless communication or wired communication to communicate with the external device (for example, the second external electronic device 104 or the server 106).

The wireless communication may include cellular communication using at least one of, for example, long-term evolution (LTE), LTE Advanced (LTE-A), code division multiple access (CDMA), wideband CDMA (WCDMA), universal mobile telecommunications system (UMTS), wireless broadband (WiBro), global system for mobile communications (GSM), or the like. According to an example embodiment, as indicated by reference numeral 164 in FIG. 1, the wireless communication may include at least one of wireless fidelity (WiFi), light fidelity (LiFi), Bluetooth, Bluetooth low energy (BLE), Zigbee, near field communication (NFC), magnetic secure transmission, radio frequency (RF), or a body area network (BAN). According to an example embodiment, the wireless communication may include global navigation satellite system (GNSS). The GNSS may include, for example, global positioning system (GPS), global navigation satellite system (Glonass), BeiDou navigation satellite system (hereinafter, referred to as "BeiDou") or Galileo, the European global satellite-based navigation system. Hereinafter, "GPS" and "GNSS" may be interchangeably used in the present disclosure. The wired communication may include at least one of, for example, a universal serial bus (USB), a high-definition multimedia interface (HDMI), a recommended standard-232 (RS-232), power line communication, or a plain old telephone service (POTS). The network 162 may include at least one of telecommunications networks, for example, a computer network (for example, local area network (LAN) or wide area network (WAN)), an internet, or a telephone network.

According to an example embodiment, the wired communication may be established by electrically connecting a connector embedded in the electronic device 101 and an external connector embedded in the external electronic device 102. For example, the electronic device 101 may identify the external electronic device 102 connected thereto via the connector. The electronic device 101 may perform various operation flows for controlling signal transmission and reception with the identified external electronic device 102. The electronic device 101 may receive at least one of an analogue signal, a digital signal, or a power source (or power) signal from the external electronic device 102, or may transmit such signals to the external electronic device 102.

The connector may be mounted on a PCB. According to an example embodiment, the PCB may include a first ground having the same potential as that of the connector, and a second ground having a different potential from that of the first ground and physically isolated from the first ground. According to various example embodiments, the second ground may be electrically connected with another conductive portion (for example, a portion of a housing) of the electronic device 101, and the grounds may be extended. When signals or data are exchanged with an external device via the connector, a noise occurring in the connector may be distributed to the first ground, the second ground, or another conductive portion electrically connected with the second ground, and thus may be reduced. This can enhance an electric influence by the connector. For example, a relatively high noise floor from among noises occurring in the connector may be reduced by the second ground or another conductive portion electrically connected with the second ground.

The communication interface 170 may support various types of communication standards related to the connector. According to an example embodiment, the electronic device 101 may be designed to include a USB 3.0 connector or a USB 3.1 connector, or a connector supporting a communication interface of a higher version. For example, when signals or data are exchanged with an external device via the USB 3.0 connector or the USB 3.1 connector, or a connector of a higher version, a relatively high noise floor (for example, a measurement value regarding a sum of noises) may be detected in comparison to a connector supporting low-speed data transmission or low operating frequency. A relatively high noise floor from among noises occurring in the USB 3.0 connector or the USB 3.1 connector, or a connector supporting a communication interface of a higher version may be reduced by the second ground having the different potential from that of the connector or another conductive portion (for example, a portion of the housing) electrically connected with the second ground.

Each of the first and second external electronic devices 102, 104 may be the same or different type of device as or from the electronic device 101. According to various embodiments, all or a portion of operations that the electronic device 101 will perform may be executed by another or plural other electronic devices (for example, the electronic devices 102, 104 or the server 106). According to an example embodiment, when the electronic device 101 should execute any function or service automatically or in response to a request, the electronic device 101 may not perform the function or the service internally, but, alternatively or additionally, it may request at least a portion of a function associated with the electronic device 101 at other device (for example, the electronic device 102, 104 or the server 106). The other electronic device (for example, the electronic device 102, 104 or the server 106) may execute the requested function or additional function and may transmit the execution result to the electronic device 101. The electronic device 101 may provide the requested function or service using the received result or may additionally process the received result to provide the requested function or service. To achieve this, for example, cloud computing, distributed computing, or client-server computing may be used.

Figure 2:
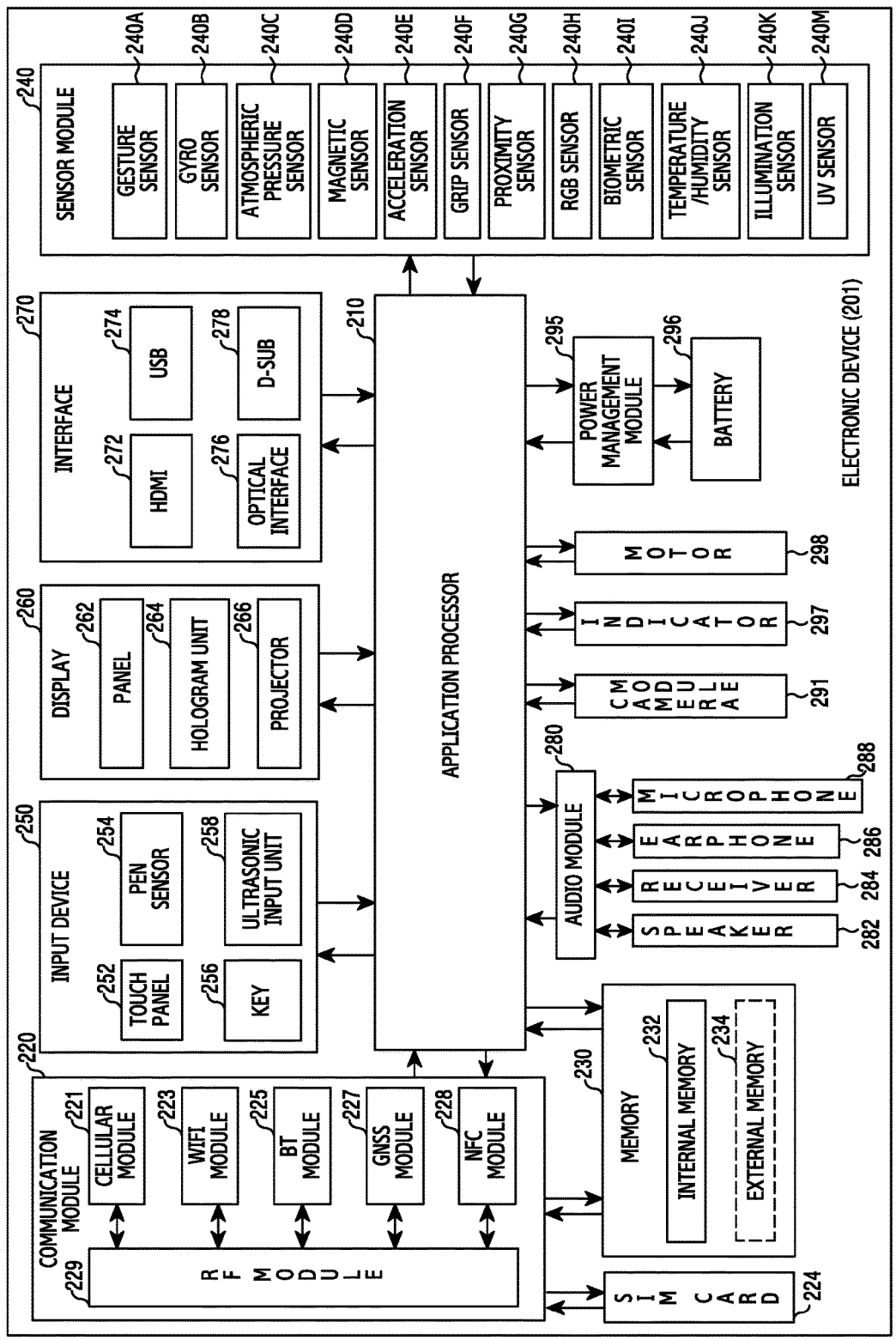
FIG. 2 is a block diagram illustrating an example electronic device according to various example embodiments.

FIG. 2 is a block diagram illustrating an example electronic device 201 according to various embodiments. The electronic device 201 may include, for example, all or a portion of the electronic device 101 illustrated in FIG. 1. The electronic device 201 may include one or more processors 210 (for example, an AP), a communication module 220, a subscriber identification module 224, a memory 230, a sensor module 240, an input device 250, a display 260, an interface 270, an audio module 280, a camera module 291, a power management module 295, a battery 296, an indicator 297, and a motor 298.

The processor 210 may include various processing circuitry and drive an operating system (OS) or an application program to control a plurality of hardware or software elements connected to the processor 210, and may process and compute a variety of data. The processor 210 may be implemented with a System on Chip (SoC), for example. According to an example embodiment, the processor 210 may further include a graphic processing unit (GPU) and/or an image signal processor. The processor 210 may include at least a portion (for example, a cellular module 221) of the elements illustrated in FIG. 2. The processor 210 may load and process a command or data, which is received from at least one of the other elements (for example, a nonvolatile memory) at a volatile memory, and may store resulting data at a nonvolatile memory.

The communication module 220 may be configured the same as or similar to the communication interface 170. The communication module 220 may include various communication circuitry, such as, for example, and without limitation, a cellular module 221, a Wi-Fi module 223, a Bluetooth module 225, a GNSS module 227, an NFC module 228, and/or an RF module 229. The cellular module 221 may provide, for example, voice communication, video communication, a messaging service, an Internet service or the like through a communication network.

According to an example embodiment, the cellular module 221 may perform discrimination and authentication of the electronic device 201 within a communication network using the subscriber identification module 224 (for example, a SIM card), for example. According to an example embodiment, the cellular module 221 may perform at least a portion of functions that the processor 210 provides. According to an example embodiment, the cellular module 221 may include a communication processor (CP). According to an example embodiment, at least a portion (for example, two or more) of the cellular module 221, the Wi-Fi module 223, the Bluetooth module 225, the GNSS module 227, and the NFC module 228 may be included within one integrated chip (IC) or an IC package. The RF module 229 may transmit and receive a communication signal (for example, an RF signal). The RF module 229 may include a transceiver, a power amplifier module (PAM), a frequency filter, a low noise amplifier (LNA), an antenna, or the like. According to another embodiment, at least one of the cellular module 221, the Wi-Fi module 223, the Bluetooth module 225, the GNSS module 227, or the NFC module 228 may transmit and receive an RF signal through a separate RF module.

The subscriber identification module 224 may include, for example, a card or an embedded SIM including a subscriber identification module, and may include unique identification information (for example, an integrated circuit card identifier (ICCID)) or subscriber information (for example, integrated mobile subscriber identity (IMSI)).

The memory 230 (for example, the memory 130) may include an internal memory 232 and/or an external memory 234. For example, the internal memory 232 may include at least one of a volatile memory (for example, a dynamic random access memory (DRAM), a static RAM (SRAM), or a synchronous DRAM (SDRAM)), and a nonvolatile memory (for example, a one-time programmable read only memory (OTPROM), a programmable ROM (PROM), an erasable and programmable ROM (EPROM), an electrically erasable and programmable ROM (EEPROM), a mask ROM, a flash ROM, a flash memory, a hard drive, or a solid state drive (SSD)). The external memory 234 may include a flash drive, for example, compact flash (CF), secure digital (SD), micro secure digital (Micro-SD), mini secure digital (Mini-SD), extreme digital (xD), multimedia card (MMC), a memory stick, or the like. The external memory 234 may be functionally or physically connected to the electronic device 201 through various interfaces.

The sensor module 240 may measure, for example, a physical quantity or may detect an operation state of the electronic device 201, and may convert the measured or detected information to an electrical signal. The sensor module 240 may include at least one of, for example, a gesture sensor 240A, a gyro sensor 240B, a barometer (e.g., atmospheric pressure) sensor 240C, a magnetic sensor 240D, an acceleration sensor 240E, a grip sensor 240F, a proximity sensor 240G, a color sensor 240H (for example, a red, green, blue (RGB) sensor), a biometric sensor 240I, a temperature/humidity sensor 240J, an illuminance (e.g., illumination) sensor 240K, and/or an UV sensor 240M. Additionally or alternatively, the sensor module 240 may include, for example, an E-nose sensor, an electromyography sensor (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit for controlling at least one sensor included therein. According to an example embodiment, the electronic device 201 may further include a processor which is a portion of the processor 210 or a separate element from the processor 210 and is configured to control the sensor module 240. The processor 210 may control the sensor module 240 while the processor 210 remains at a sleep state.

The input device 250 may include various input circuitry, such as, for example, and without limitation, a touch panel 252, a (digital) pen sensor 254, a key 256, and/or an ultrasonic input device 258, or the like. The touch panel 252 may use at least one of a capacitive, resistive, infrared or ultrasonic detecting method. Also, the touch panel 252 may further include a control circuit. The touch panel 252 may further include a tactile layer to provide a tactile reaction to a user.

The (digital) pen sensor 254 may be, for example, a portion of a touch panel or may include an additional sheet for recognition. The key 256 may include, for example, a physical button, an optical key, a keypad, and the like. The ultrasonic input device 258 may detect an ultrasonic wave, which is generated from an input tool, through a microphone (for example, a microphone 288), and may identify data corresponding to the detected ultrasonic wave.

The display 260 (for example, the display 160) may include a panel 262, a hologram device 264, a projector 266, and/or a control circuit for controlling the aforementioned elements. The panel 262 may be implemented to be flexible, transparent, or wearable. The panel 262 and the touch panel 252 may be integrated into one or more modules. According to an example embodiment, the panel 262 may include a pressure sensor (or a force sensor) for measuring an intensity of pressure on a user's touch. The pressure sensor may be integrated into the touch panel 252 or may be implemented with one or more sensors separate from the touch panel 252. The hologram device 264 may display a stereoscopic image in a space using a light interference phenomenon. The projector 266 may project light onto a screen so as to display an image. The screen may be arranged inside or outside the electronic device 201.

The interface 270 may include various interface circuitry, such as, for example, and without limitation, an HDMI 272, a USB 274, an optical interface 276, and/or a D-subminiature (D-sub) 278, or the like. The interface 270 may be included, for example, in the communication interface 170 illustrated in FIG. 1. Additionally or alternatively, the interface 270 may include, for example, a mobile high definition link (MHL) interface, a SD card/multi-media card (MMC) interface, or an infrared data association (IrDA) standard interface.

The audio module 280 may convert a sound and an electric signal in dual directions. At least a portion of the audio module 280 may be included, for example, in the input/output interface 145 illustrated in FIG. 1. The audio module 280 may process, for example, sound information that is inputted or outputted through a speaker 282, a receiver 284, an earphone 286, or a microphone 288. The camera module 291 may be, for example, a device for shooting a still image or a video, and according to an example embodiment, the camera module 291 may include, for example, one or more image sensors (for example, a front sensor or a rear sensor), a lens, an image signal processor (ISP), or a flash (for example, an LED or a xenon lamp). The power management module 295 may manage, for example, power of the electronic device 201. According to one embodiment, the power management module 295 may include a power management integrated circuit (PMIC), a charger IC, or a battery or fuel gauge. The PMIC may have a wired charging method and/or a wireless charging method. The wireless charging method may include, for example, a magnetic resonance method, a magnetic induction method or an electromagnetic wave method. The PMIC may further include an additional circuit for wirelessly charging, for example, a coil loop, a resonance circuit, or a rectifier, and the like. The battery gauge may measure, for example, a remaining capacity of the battery 296 and a voltage, current or temperature thereof while the battery is charged. The battery 296 may include, for example, a rechargeable battery and/or a solar battery.

The indicator 297 may display a specific state of the electronic device 201 or a portion thereof (for example, the processor 210), such as a booting state, a message state, a charging state, and the like. The motor 298 may convert an electrical signal into a mechanical vibration and may generate vibration, a haptic effect, and the like. For example, the electronic device 201 may include a mobile TV supporting device (for example, a GPU) for processing media data according to the standards of digital multimedia broadcasting (DMB), digital video broadcasting (DVB), MediaFlo™, or the like.

The electronic device 201 may include a PCB including a plurality of elements (for example, the one or more processors 210 (for example, an AP), the communication module 220, the subscriber identification module 224, the memory 230, the sensor module 240, the input device 250, the display 260, the interface 270, the audio module 280, the camera module 291, the power management module 295, the battery 296, the indicator 297, or the motor 298), or electrically connected with at least one of the plurality of elements.

According to an example embodiment, the PCB may include a connector, and may include a first ground having the same potential as that of the connector, and a second ground having a different potential from that of the first ground and physically isolated from the first ground. According to various example embodiments, the second ground may be electrically connected with another conductive portion (for example, a portion of a housing) of the electronic device 201, and the ground may be extended. When signals or data are exchanged with an external device via the connector, a noise occurring in the connector may be distributed to the first ground, the second ground, or another conductive portion electrically connected with the second ground, and thus may be reduced. This can enhance an electric influence by the connector. For example, a relatively high noise floor from among noises occurring in the connector may be reduced by the second ground or another conductive portion electrically connected with the second ground. A PCB including a connector and grounds with different potentials, and an electronic device having the same will be described in greater detail below with reference to FIGS. 3 to 18B.

Each of the elements described in the present disclosure may be configured with one or more components, and the names of the elements may be changed according to the type of the electronic device. According to various embodiments, some elements of the electronic device (for example, the electronic device 201) may be omitted or other additional elements may be added. Furthermore, some of the elements may be combined with each other so as to form one entity, and the functions of the elements may be performed in the same manner as before being combined.

Figure 3:
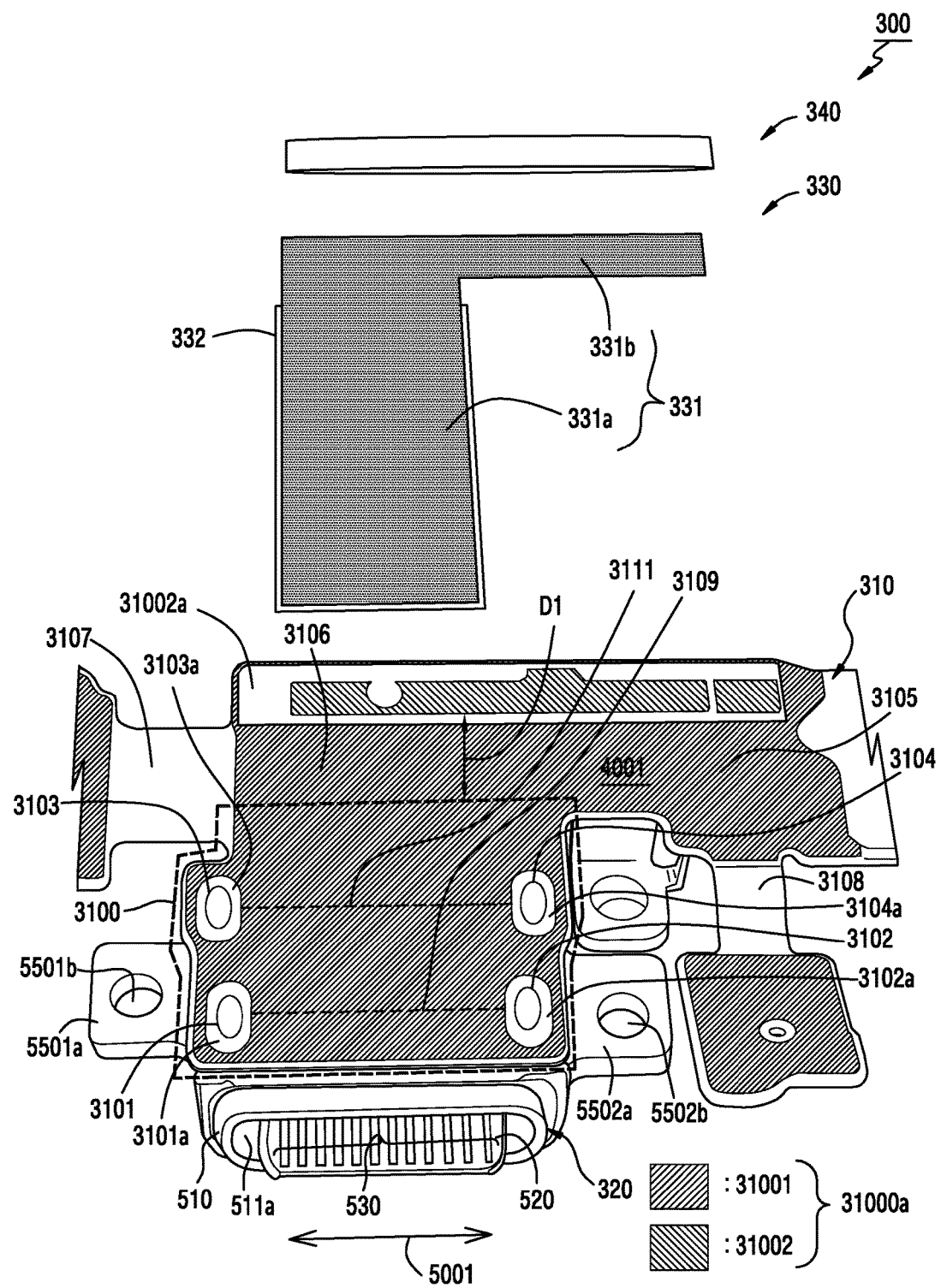
FIG. 3 is an exploded perspective view illustrating a PCB including a connector and grounds with different potentials according to an example embodiment.

FIG. 3 is an exploded perspective view illustrating an example PCB including a connector and grounds with different potentials according to an example embodiment. Referring to FIG. 3, a PCB 300 according to an example embodiment may include a substrate 310 and a connector 320.

The substrate 310 may support input and output and exchange of data among elements. According to various example embodiments, at least one of the various elements of FIG. 2 (for example, the one or more processors 210 (for example, an AP), the communication module 220, the subscriber identification module 224, the memory 230, the sensor module 240, the input device 250, the display 260, the interface 270, the audio module 280, the camera module 291, the power management module 295, the battery 296, the indicator 297, or the motor 298) may be mounted on the substrate 310, or may be electrically connected to the substrate 310.

Figure 4:
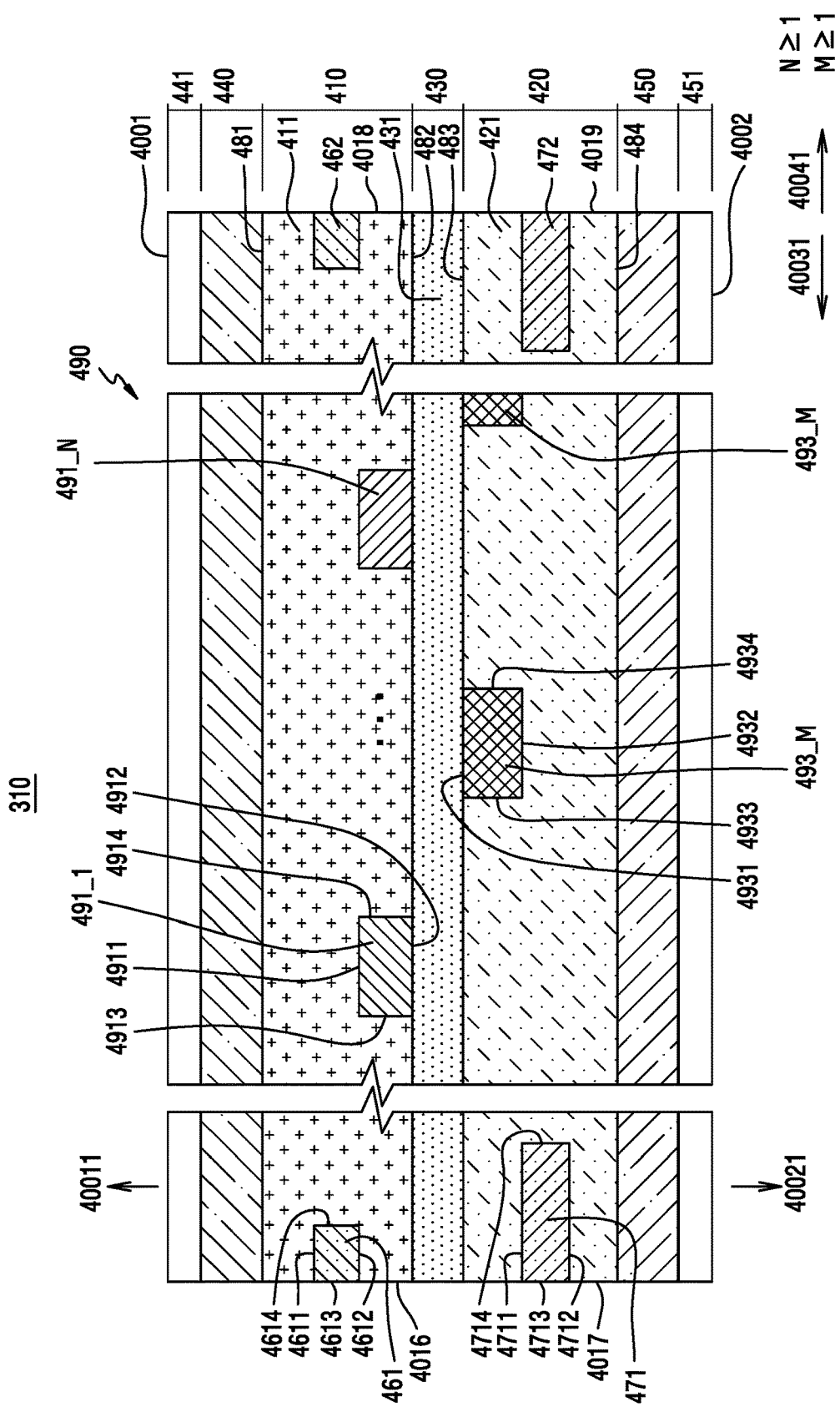
FIG. 4 is a cross-sectional view illustrating a substrate including grounds different potentials according to an example embodiment.
Figure 5A:
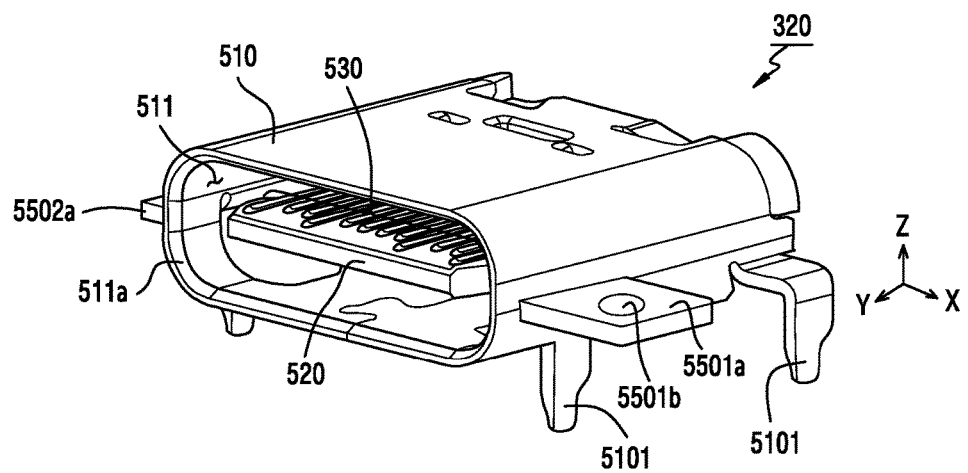
Figure 5B:
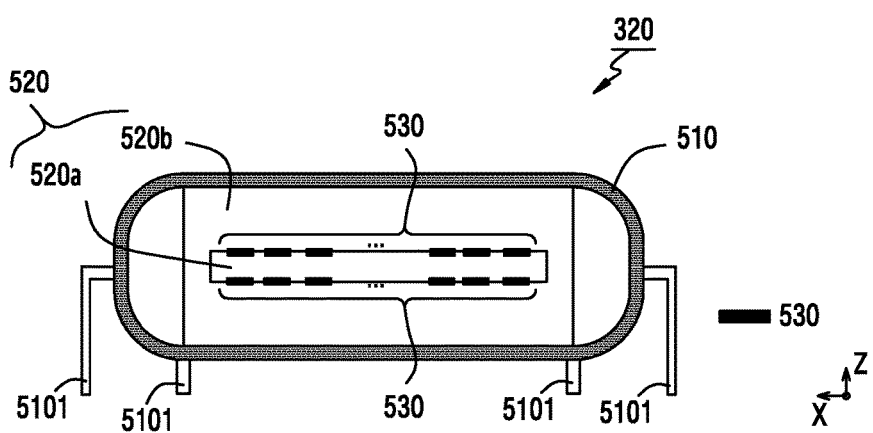

FIG. 4 is a cross-sectional view illustrating the substrate 310 including grounds with different potentials according to an example embodiment. The substrate 310 may be designed to have a plurality of signal lines 490 disposed therein and a plurality of elements coupled to the plurality of signal lines. According to an example embodiment, at least a portion of the plurality of signal lines 490 may be a conductive path through which signals related to data are transmitted between a transmitting side and a receiving side. In explaining the plurality of signal lines 490 and other elements of the substrate 310 associated therewith, it will be understood that, when an A element, a B element, and a C element are mentioned as being arranged in a second direction 40021 shown in FIG. 4, the A element may be disposed on the B element and the C element may be disposed under or beneath the B element.

Referring to FIG. 4, the substrate 310 may include a plurality of layers. According to an example embodiment, the substrate 310 may include a second layer 420 disposed under or beneath a first layer 410. The first layer 410 may include an A surface 481 and a B surface 482 disposed under or beneath the A surface 481. The second layer 420 may include a C surface 483 disposed under or beneath the B surface 482, and a D surface 484 disposed under or beneath the C surface 483.

According to an example embodiment, the A surface 481 and the D surface 484 may be substantially parallel to each other. For example, the substrate 310 may be a rigid substrate and may have a flat plate shape. The A surface 481 may be a surface that faces toward a first direction 40011, and the D surface 484 may be a surface that faces toward the second direction 40021 opposite the first direction 40011. According to various example embodiments, the B surface 482 and/or the C surface 483 may be substantially parallel to the A surface 481 or the D surface 484.

According to various example embodiments, the substrate 310 may be designed as a flexible substrate (for example, a flexible PCB (FPCB)).

The plurality of signal lines 490 may include at least one signal line (hereinafter, a "first signal line") 491_N included in the first layer 410, or at least one signal line (hereinafter, a "second signal line") 493_M included in the second layer 420.

The at least one first signal line 491_N may be included in the first layer 410, and for example, may be disposed between the A surface 481 and the B surface 482. According to an example embodiment, the at least one first signal line 491_N may be included in the first layer 410 so as to form a portion of the B surface 482. According to various example embodiments, the at least one first signal line 491_N may be disposed in various positions between the A surface 481 and the B surface 482, although they are not illustrated.

The at least one second signal line 493_M may be included in the second layer 420, and for example, may be disposed between the C surface 483 and the D surface 484. According to an example embodiment, the at least one second signal line 493_M may be included in the second layer 420 so as to form a portion of the C surface 483. According to various example embodiments, the at least one second signal line 493_M may be arranged in various other positions between the C surface 483 and the D surface 484, although they are not illustrated.

According to an example embodiment, the at least one first signal line 491_N or the at least one second signal line 493_M may be rectangular in cross section view. For example, the at least one first signal line 491_N or the at least one second signal line 493_M may include a surface 4911, 4931 that faces toward the first direction 40011 (hereinafter, an "E surface"), a surface 4912, 4932 that faces toward the second direction 40021 (hereinafter, an "F surface"), a face 4913, 4933 that faces toward a third direction 40031 (hereinafter, a "G surface"), and a surface 4914, 4934 that faces toward a fourth direction 40041 (hereinafter, an "H surface"). According to an example embodiment, the F surface 4912 of the at least one first signal line 491_N may form a portion of the B surface 482. The E surface 4931 of the at least one second signal line 493_M may form a portion of the C surface 483. According to various embodiments, the at least one first signal line 491_N or the at least one second signal line 493_M may be designed to have various other cross-sectional shapes (for example, a circle), although they are not illustrated.

The first layer 410 may include a first dielectric substance 411 having a first dielectric constant. According to an example embodiment, the first dielectric substance 411 may cover the E surfaces 4911, the G surfaces 4913, and the H surfaces 4914 of the at least one first signal line 491_N, and may form a portion of the A surface 481 and a portion of the B surface 482. The first dielectric substance 411 may form the B surface 482 with the F surfaces 4912 of the at least one first signal line 491_N. According to various example embodiments, when the first dielectric substance 411 is designed to cover up to the F surfaces 4912 of the at least one first signal line 491_N although it is not illustrated, the entire area of the B surface 482 may be formed by the first dielectric substance 411.

The second layer 420 may include a second dielectric substance 421 having a second dielectric constant. According to an example embodiment, the second dielectric substance 421 may cover the F surface 4932, the G surface 4933, and the H surface 4934 of the at least one second signal line 493_M, and may form a portion of the D surface 484 and a portion of the C surface 483. The second dielectric substance 421 may form the C surface 483 with the E surface 4931 of the at least one second signal line 493_M. According to various example embodiments, when the second dielectric substance 421 is designed to cover up to the E surface 4931 of the second signal line 493_M although it is not illustrated, the entire area of the C surface 493 may be formed by the second dielectric substance 421.

According to an example embodiment, the substrate 310 may include at least one layer disposed between the first layer 410 and the second layer 420. For example, the substrate 310 may include a third layer 430 disposed between the first layer 410 and the second layer 420. The third layer 430 may be coupled to the B surface 482 of the first layer 410 and the C surface 483 of the second layer 420. According to an example embodiment, the first layer 410 and the second layer 420 may be electrically isolated from each other by the third layer 430. For example, the at least one second signal line 493_M may be electrically isolated from the at least one first signal line 491_N by the third layer 430. According to an example embodiment, the third layer 430 may include at least a portion of a third dielectric substance 431 having a third dielectric constant. According to various embodiments, the third dielectric substance 431 may be formed of polyimide.

According to various embodiments, the first dielectric substance (material) 411, the second dielectric substance (material) 421, or the third dielectric substance (material) 431 may be formed of the same material or different materials. According to various embodiments, the first dielectric constant of the first dielectric substance 411, the second dielectric constant of the second dielectric substance 421, or the third dielectric constant of the third dielectric substance 421 may be the same as one another or different from one another.

According to various example embodiments, the substrate 310 may be designed to include a fourth layer 440 coupled to at least a portion of the A surface 481 of the first layer 410. The fourth layer 440 may include a conductive material and may be used as a ground.

According to various example embodiments, the substrate 310 may be designed to include a fifth layer 450 coupled to at least a portion of the D surface 484 of the second layer 420. The fifth layer 450 may include a conductive material and may be used as a ground.

According to various example embodiments, the first layer 410 may be designed to further include at least one conductive layer. The at least one conductive layer may be used as a ground. For example, the first layer 410 may include a sixth conductive layer 461 disposed between the A surface 481 and the B surface 482. According to an example embodiment, the sixth layer 461 may be disposed adjacent to a side surface 4016 of the first layer 410, and may have a plate shape extended so as to avoid overlapping the first signal line (for example, 491_1) in the proximity of the side surface 4016, as viewed in the second direction 40021. For example, the sixth layer 461 may include a surface 4611 (hereinafter, an "I surface") that faces toward the first direction 40011, a surface 4612 (hereinafter, a "J surface") that faces toward the second direction 40021, a surface 4613 (hereinafter, a "K surface") that faces toward the third direction 40031, and a face 4614 (hereinafter, an "L surface") that faces toward the fourth direction 40041. According to an example embodiment, the first dielectric substance 411 may cover the I surface 4611, the J surface 4612, and the L surface 4614 of the sixth layer 461, and may form the side surface 4016 of the first layer 410 with the K surface 4613 of the sixth layer 461. According to various example embodiments, the first dielectric substance 411 may be designed to cover up to the K surface 4613 of the sixth layer 461 although it is not illustrated. According to various example embodiments, the J surface 4612 of the sixth layer 461 may be disposed to form a portion of the B surface 482 although it is not illustrated. According to various example embodiments, the I surface 4611 of the sixth layer 461 may be disposed to form a portion of the A surface 481 although it is not illustrated. According to various example embodiments, the substrate 310 may further include a conductive layer 462 disposed adjacent to the other side surface 4018 of the first layer 410, and the conductive layer 462 may be designed similarly to the sixth layer 461.

According to various example embodiments, the second layer 420 may be designed to further include at least one conductive layer. The at least one conductive layer may be used as a ground. For example, the second layer 420 may include a seventh conductive layer 471 disposed between the C surface 483 and the D surface 484. According to an example embodiment, the seventh layer 471 may be disposed adjacent to a side surface 4017 of the second layer 420, and may have a plate shape extended so as to avoid overlapping the first signal line (for example, 491_1) in the proximity of the side surface 4017, as viewed in the second direction 40021. For example, the seventh layer 471 may include a surface 4711 (hereinafter, an "M surface") that faces toward the first direction 40011, a surface 4712 (hereinafter, an "N surface") that faces toward the second direction 40021, a surface 4713 (hereinafter, an "O surface") that faces toward the third direction 40031, and a surface 4714 (hereinafter, a "P surface") that faces toward the fourth direction 40041. According to an example embodiment, the second dielectric substance 421 may cover the M surface 4711, the N surface 4712, and the P surface 4714 of the seventh layer 471, and may form the side surface 4017 of the second layer 420 with the O surface 4713 of the seventh layer 471. According to various example embodiments, the second dielectric substance 421 may be designed to cover up to the M surface 4713 of the seventh layer 471 although it is not illustrated. According to various example embodiments, the M surface 4713 of the seventh layer 471 may be disposed to form a portion of the C surface 483, although it is not illustrated. According to various example embodiments, the N surface 4712 of the seventh layer 471 may be disposed to form a portion of the D surface 484 although it is not illustrated. According to various example embodiments, the substrate 310 may be designed to further include a conductive layer 472 disposed adjacent to the other side surface 4019 of the second layer 420, and the conductive layer 472 may be designed similarly to the seventh layer 471.

According to various example embodiments, the substrate 310 may include a first cover layer 441 to cover at least a portion of the fourth layer 440. According to various example embodiments, the substrate 310 may include a second cover layer 451 to cover at least a portion of the fifth layer 450. The first cover layer 441 or the second cover layer 451 may include a light transmitting material.

The substrate 310 may include a substrate first surface 4001 substantially exposed toward the first direction 40011. According to an example embodiment, referring to FIG. 4, when the upper cover layer 441 is designed along the entire area of the fourth layer 440, the first cover layer 441 may form the entirety of the substrate first surface 4001. According to various example embodiments, when the first cover layer 441 is designed along a portion of the fourth layer 440, the first cover layer 441 may form a portion of the substrate first surface 4001 and the fourth layer 440 may form a portion of the substrate first surface 4001, although it is not illustrated. According to various example embodiments, when the first cover layer 441 is not designed and the fourth layer 440 is designed along the entire area of the first layer 410, the fourth layer 440 may form the entirety of the substrate first surface 4001, although it is not illustrated. According to various example embodiments, when the first cover layer 441 is not designed and the fourth layer 440 is formed along a portion of the first layer 410, the fourth layer 440 may form a portion of the substrate first surface 4001, and the first layer 410 may form a portion of the substrate first surface 4001, although it is not illustrated. According to various example embodiments, when the fourth layer 440 and the first cover layer 441 are not designed on the first layer 410, the A surface 481 of the first layer 410 may form the substrate first surface 4001, although it is not illustrated.

The substrate 310 may include a substrate second surface 4002 substantially exposed toward the second direction 40021. According to an example embodiment, referring to FIG. 4, when the second cover layer 451 is designed along the entire area of the fifth layer 450, the second cover layer 451 may form the entirety of the substrate second surface 4002. According to various example embodiments, when the second cover layer 441 is designed along a portion of the fifth layer 450, the second cover layer 451 may form a portion of the substrate second surface 4002 and the fifth layer 450 may form a portion of the substrate second surface 4002, although it is not illustrated. According to various example embodiments, when the second cover layer 451 is not designed and the fifth layer 450 is designed along the entire area of the second layer 420, the fifth layer 450 may form the entirety of the substrate second surface 4002, although it is not illustrated. According to various example embodiments, when the second cover layer 451 is not designed and the fifth layer 450 is formed along a portion of the second layer 420, the fifth layer 450 may form a portion of the substrate second surface 4002, and the second layer 420 may form a portion of the substrate second surface 4002, although it is not illustrated. According to various example embodiments, when the fifth layer 450 and the second cover layer 451 are not designed under or beneath the second layer 420, the D surface 484 of the second layer 410 may form the substrate second surface 4002, although it is not illustrated.

According to an example embodiment, at least a portion of the plurality of signal lines 490 may be electrically connected with a plurality of terminals (for example, a tail 5304 of FIG. 6A) of a connector (for example, 320 of FIG. 3).

According to various example embodiments, the substrate 310 is not limited to the structure of FIG. 4 and may be designed in various shapes, selectively including at least a portion of the first layer 410, the second layer 420, the third layer 430, the fourth layer 440, the fifth layer 450, the sixth layer 461 or 462, the seventh layer 471 or 472, the first cover layer 441, or the second cover 442.

FIGS. 5A and 5B and FIGS. 6A and 6B are diagrams illustrating a connector according to an example embodiment. Referring to FIGS. 3, 5A, 5B, and 6A, the connector 320 (for example, a receptacle) may include a shell 510, a tongue 520, and a plurality of contacts 530.

According to an example embodiment, the shell 510 may have a substantially tubular shape having one side opened, and may include a passage 511 to allow a connector (for example, a plug) (not shown) of an external device to be inserted therethrough. An opening 511a may be formed on one side of the passage 511, and the connector of the external device may be moved to the passage 511 of the shell 510 through the opening 511a. The passage 511 of the shell 510 may be straightly extended in a moving direction of the plug, and the plug may be guided to the passage 511 of the shell 510 and may have at least a portion thereof inserted into the shell 510.

According to an example embodiment, the shell 510 may be designed to allow a connector (for example, a plug) of an external device to be inserted into the connector 320 without distinction between upper and lower portions of the connector. The passage 511 of the shell 510 may be designed to have a vertically and horizontally symmetric space in cross section view.

The connector 320 may include a plurality of leads 5101 protruding and extended from the shell 510. Referring to FIG. 3, in an example embodiment, the substrate 310 may include a connector installation area 3100 on which the connector 320 is disposed. The connector installation area 3100 may include a plurality of component holes 3101, 3102, 3103, 3104. According to an example embodiment, the plurality of component holes 3101, 3102, 3103, 3104 may be structures disposed at four vertexes of a virtual rectangle, respectively. According to various example embodiments, a virtual line 3109 (hereinafter, a "first virtual line) connecting the first component hole 3101 and the second component hole 3102, may be substantially parallel to a virtual line 3111 (hereinafter, a "second virtual line) connecting the third component hole 3103 and the fourth component hole 3104. The plurality of leads 5101 of the connector 320 may be inserted into the plurality of component holes 3101, 3102, 3103, 3104 of the substrate 310, respectively, and the shell 510 may be disposed on the substrate second surface (for example, 4002 of FIG. 4), and ends of the plurality of leads 5101 may protrude from the substrate first surface 4001 of the substrate 310. The substrate first surface 4001 may include lands 3101a, 3102a, 3103a, 3104a (for example, copper foil pads) formed on the periphery of the plurality of component holes 3101, 3102, 3103, 3104. The ends of the plurality of leads 5101 may be coupled to the lands 3101a, 3102a, 3103a, 3104a of the substrate 310 by using soldering, and the connector 320 may be mounted on the substrate 310.

The connector installation area 3100 may include one or more lands, vias, etc. associated with the connector 320, in addition to the plurality of component holes 3101, 3102, 3103, 3104. For example, tails (or terminals) (for example, 5304 of FIG. 6A) of the connector 320 may be coupled to lands (not shown) formed on the connector installation area 3100 by using soldering. According to various example embodiments, the connector installation area 3100 may include at least a portion of the signal lines (for example, 490 of FIG. 4) associated with the connector 320.

According to an example embodiment, the connector installation area 3100 may protrude and be extended from the other area 3105 of the substrate 310.

At least a portion of the shell 510 may include a conductive material (for example, and without limitation, stainless steel or phosphor bronze). According to an example embodiment, the shell 510 may be electrically connected to the substrate 310 through the plurality of leads 5101. For example, the shell 510 may be electrically connected to a ground (for example, the fourth layer 440, the fifth layer 450, the sixth layer 461 or 462, or the seventh layer 471 or 472 of FIG. 4) of the substrate 310 through the plurality of leads 5101.

Figure 6A:
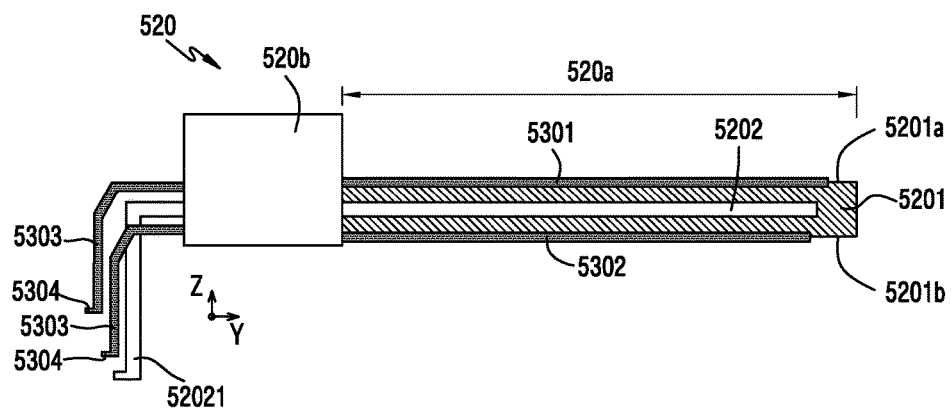

According to an example embodiment, the tongue 520 may be disposed within the passage 511 of the shell 510 and may be similar to a cantilever. Referring to FIG. 6A, for example, the tongue 520 may include a fixing portion 520b coupled to the shell 510 and an extension portion 520a coupled to the fixing portion 520b. The extension portion 520a may have a substantially plate shape and may have one end fixed to the fixing portion 520b and the other end free.

Referring to FIG. 6A, in an example embodiment, the tongue 520 may include a base plate 5201 formed of a nonconductive material (for example, glass-filled nylon), and a mid-plate 5202 disposed inside the base plate 5201. The base plate 5201 may include a nonconductive material, and a plurality of contacts 530 may be disposed on both side surfaces 5201a, 5201b of the base plate 5201.

According to various example embodiments, at least a portion of the mid-plate 5202 may include a conductive material or a nonconductive material. According to an example embodiment, a conductive portion of the mid-plate 5202 may be electrically connected to the substrate (for example, 310 of FIG. 3). Referring to FIG. 6A, the mid-plate 5202 may include at least one lead 52021 extended from the tongue 520. The lead 52021 may be electrically connected to a land (not shown) installed on the substrate (for example, 310 of FIG. 3) by using soldering. According to various example embodiments, the conductive portion of the mid-plate 5202 may be electrically connected to a ground of the substrate 310 (for example, the fourth layer 440, the fifth layer 450, the sixth layer 461 or 462, or the seventh layer 471 or 472 of FIG. 4).

Referring to FIG. 6A, in an example embodiment, the plurality of contacts (or pins) 530 may include a first contact section 5301, 5302 and a second contact section 5303. The first contact section 5301, 5302 may be disposed on the tongue 520 (for example, the base plate 5201). The second contact section 5303 may be extended from the first contact section 5301, 5302, and may have an end thereof electrically connected to the substrate (for example, 310 of FIG. 3). For example, the second contact section 5303 may include a tail (or a terminal) 5304 coupled to a land (not shown) formed on the substrate 310 by using soldering.

According to an example embodiment, the plurality of terminals (for example, tails 5304) of the connector 320 may be electrically connected to at least a portion of the plurality of signal lines (for example, 490 of FIG. 4) of the substrate 310.

According to various example embodiments, at least one of the first contact sections 5301, 5302 of the plurality of contacts 530 may include an elastic portion which has a bent shape. When the connector 320 and a connector (for example, a plug) of an external device are coupled to each other, the elastic portion may improve an electric connection between the first contact section 5301, 5302 of the plurality of contacts 530 and contacts of the plug.

FIG. 6B is a diagram illustrating a contact map of the connector (for example, the receptacle) according to an example embodiment. Referring to FIG. 6B, the plurality of contacts (for example, 530 of FIG. 3, 5A, or 5B) may include A contacts A1-A12 and B contacts B1-B12. According to an example embodiment, the A contacts A1-A12 may be arranged on one side surface 5201a of the base plate (for example, 5201 of FIG. 6A), and the B contacts B1-B12 may be arranged on the other side surface 5201b of the base plate 5201. According to an example embodiment, the contacts of the connector 320 may include ground contacts A1, A12, B1, B12, contacts A2, A3, A10, A11, B2, B3, B10, and B11 supporting high speed transmission of digital data, contacts A4, A9, B4, B9 supporting power supply, channel configuration (CC) contacts A5, B5, sideband use (SBU) contacts A8, B8, and contacts A6, A7, B6, B7 supporting low speed data transmission. According to an example embodiment, the contacts of respective functions may be designed to be arranged as shown in FIG. 6B so as to form an appropriate electric connection between connectors even when a connector of an external device is inserted into the connector 320 without distinction between upper and lower portions thereof. According to various example embodiments, the connector 420 may include a "C-type connector" or a "reversible connector."

The substrate 310 may include a control circuit (not shown) electrically connected to the connector 320. According to an example embodiment, the control circuit may include a power management unit (PMU) (not shown). For example, the PMU may control a power source to minimize power consumption according to an operation of a processor (for example, 120 of FIG. 1 or 210 of FIG. 2). According to various example embodiments, the PMU may control a charging operation based on a charging state, etc. of the battery. According to various example embodiments, the PMU may control an operation of transmitting and receiving power to an external device connected to the connector 320 through a Vbus contact (for example, A4, A9, B4, or B9 of FIG. 6B) or a CC contact (for example, A5 or B5 of FIG. 6B) of the connector 320.

According to various example embodiments, the control circuit may include a processor (not shown) (for example, the processor 120 of FIG. 1 or the processor 210 of FIG. 2). For example, the processor may transmit and receive digital data signals. For example, the processor may transmit a USB data signal (for example, USB D+, USB D-) to a USB controller. In another example, the processor may transmit a signal for controlling an operation of the USB controller. For example, when a type of an external device connected through the connector 320 is identified, the processor may transmit, to the USB controller, a signal for transmitting an appropriate signal to the identified external device (or type of the external device).

According to various example embodiments, the control circuit may include a USB controller (not shown). For example, the USB controller may detect whether an external device is connected, an operation mode of an electronic device, or a type of an external device connected, based on at least a signal received through the plurality of contacts 530 of the connector 320.

According to various example embodiments, the USB controller may obtain information included in a CC signal received from the CC contact (for example, A5 or B5 of FIG. 6B) of the connector 320, for example, an impedance of a pull-down resistance (or a voltage measured by a pull-down resistance), a voltage measured in an open state, or a resistance caused by a cable, and may detect whether an external device is connected, an operation mode of an electronic device, or a type of an external device connected, based on at least the above-mentioned information.

According to various example embodiments, the USB controller may detect a type of an external device connected to the electronic device based on at least a SBU signal received from the SBU contact (for example, A8 or B8 of FIG. 6B) of the connector 320. The USB controller may detect the type of the external device connected to the electronic device by identifying an ID (or an external device ID impedance value) of the external device included in the SBU signal.

According to various example embodiments, the USB controller may include a communication integrated circuit (IC), and may detect the type of the external device connected to the electronic device by the communication IC communicating with the external device through the SBU contact of the connector 320. For example, the communication IC may transmit and receive a signal including at least one of an audio output method, a type, a vendor, or a serial number of the external device through the SBU contact of the connector 320. In another example, the communication IC may authenticate the vendor by communicating with the external device through the SBU contact of the connector 320.

Figure 7:
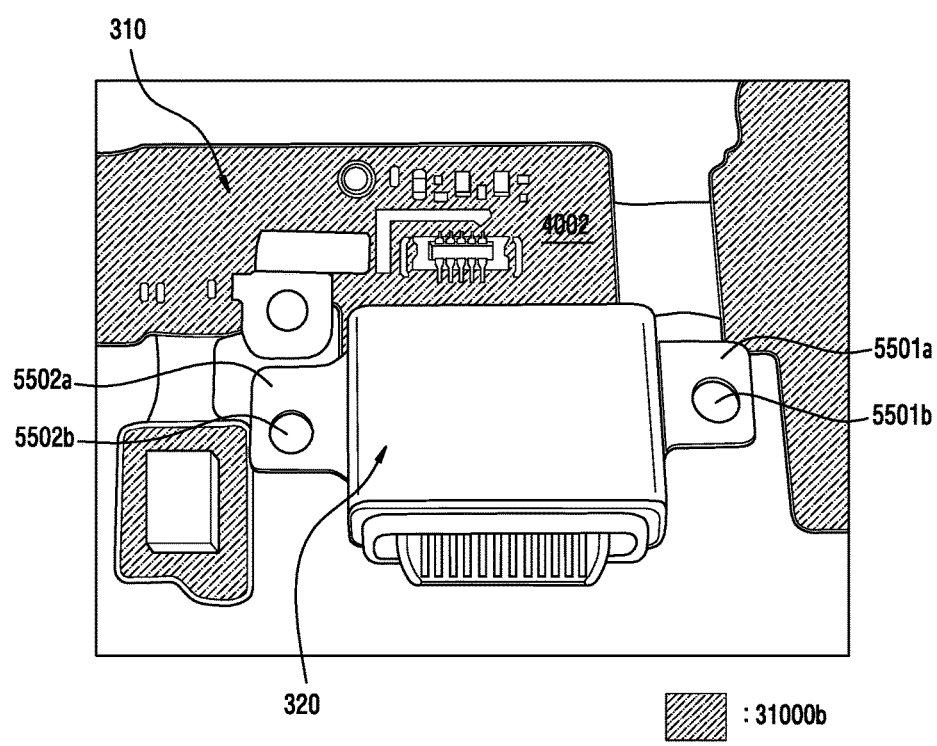
FIG. 7 is a diagram illustrating a substrate and a connector which are coupled to each other according to an example embodiment.

Referring to FIGS. 3 and 7, according to various example embodiments, the connector 320 may include extension portions 5501a, 5502a protruding and extended from the shell 510. According to an example embodiment, a pair of extension portions 5501a, 5502a may be extended in an arrangement direction 5001 of the plurality of contacts 530. The extension portions 5501a, 5502a may include penetrating holes 5501b, 5502b. When the substrate 310 having the connector 320 mounted thereon is installed in an electronic device (for example, 101 of FIG. 1 or 201 of FIG. 2), the extension portions 5501a, 5502a of the connector 302 may be coupled to a support structure (for example, 1300 of FIG. 13) of the electronic device using a bolt. For example, the connector 320 may be coupled to the support structure by allowing the plurality of bolts to pass through the penetrating holes 5501b, 5502b (or bolt screwing holes) of the extension portions 5501a, 5502a and then screwing the bolts into bosses (for example, a metal or nonmetal cluster including a female screw) formed on the support structure of the electronic device.

Referring to FIG. 3, the substrate 310 may include an A ground 31000a disposed along at least a portion of the substrate first surface 4001. The A ground 31000a may include, for example, at least a portion of the fourth layer 440 of FIG. 4.

The A ground 31000a may include at least one first ground 31001 and at least one second ground 31002. For example, the substrate 310 may include an area 31002a (for example, a portion of the A surface 481 of the first layer 410 of FIG. 4) that is not occupied by the first ground 31001, and the second ground 31002 may be coupled to this area 31002a (hereinafter, a "second ground installation area"). For example, the second ground 31002 may be coupled to the second ground installation area 31002a, and may be physically isolated from the first ground 31001 (for example, a metal island structure).

The at least one first ground 31001 may be disposed along at least a portion of an area outside the second ground installation area 31002a. For example, at least a portion of the first ground 31001 may be disposed along at least a portion of the connector installation area 3100. For example, the first ground 31001 may be disposed along at least a portion of an area between the connector installation area 3100 and the second ground installation area 31002a.

According to various example embodiments, the substrate 310 may include a connection portion (for example, 3107 or 3108) connecting two portions of the substrate 310. The connection portion 3107 or 3108 may have flexibility. According to an example embodiment, the connection portion 3107 or 3108 may include an FPCB. The first ground 31001 may be formed on two portions of the substrate 310, and the connection portion 3107 or 3108 may include a line (or a signal line) electrically connecting the grounds formed on the two portions. According to various example embodiments, the first ground 31001 may be disposed along at least a portion of the connection portion 3107 or 3108 although it is not illustrated.

According to an example embodiment, the second ground installation area 31002a may have a shape having a length extended in a direction (for example, 3001) between the first component hole 3101 and the second component hole 3102. According to various example embodiments, the second ground installation area 31002a may be designed in various shapes although they are not illustrated.

According to various example embodiments, the second ground installation area 31002a may be designed to be surrounded by the first ground 31001.

According to various example embodiments, the second virtual line 3111 may be disposed between the second ground installation area 31002a and the first virtual line 3109.

According to various example embodiments, at least a portion of the second ground 31002 may be extended substantially in parallel with the first virtual line 3109 or the second virtual line 3111.

According to various example embodiments, a distance D1 between the second ground 31002 and the connector installation area 3100 may be less than or equal to 20 mm.

FIG. 7 is a diagram illustrating the substrate 310 and the connector 320 which are coupled to each other according to an example embodiment. Referring to FIGS. 3 and 7, in an example embodiment, the substrate 310 may include a B ground 31000b disposed along at least a portion of the substrate second surface 4002. The B ground 31000b may include at least a portion of the fifth layer 450 of FIG. 4, for example.

According to various example embodiments, at least a portion of the B ground 31000b may be disposed along at least a portion of the connector installation area (for example, 3100 of FIG. 3) although it is not illustrated. According to various example embodiments, at least a portion of the B ground 31000b may overlap the second ground installation area 31002a. For example, at least a portion of the B ground 31000*b* may overlap at least a portion of the first ground 31001 or the second ground 31002 of the A ground 31000*a*.

According to an example embodiment, the first ground 31001 or the B ground 31000*b* may be designed to have the same potential as that of the connector 320. For example, the shell 510 of the connector 320 may be electrically connected with the first ground 31001 or the B ground 31000*b* of the substrate 310 through the plurality of leads (for example, 5101 of FIG. 5A or 5B). For example, the ground contact (for example, A1, A12, B1 or B12 of FIG. 6B) from among the plurality of contacts 530 of the connector 320 may be electrically connected with the first ground 31001 or the B ground 31000*b* of the substrate 310.

According to an example embodiment, the second ground 31002 may be designed to have a different potential from that of the connector 320, the first ground 31001, or the B ground 31000*b*.

According to an example embodiment, the second ground 31002 may be electrically connected to at least one source or element (for example, an active element) mounted on the substrate 310. According to an example embodiment, the substrate 310 may include a capacitor mounted on the substrate first surface 4001, and the capacitor may be electrically connected with the second ground 31002 through a line (or a signal line) formed in the substrate 310. According to another example embodiment, the substrate 310 may include a capacitor mounted on the substrate second surface 4002, and the capacitor may be electrically connected with the second ground 31002 through a via formed in the substrate 310. According to an example embodiment, the at least one element may be disposed on a connection portion (for example, line) between the second ground 31002 and the first ground 31001. According to various example embodiments, the at least one element may be disposed on a connection portion (for example, line) between the second ground 31002 and the B ground 31000*b*.

A connector (for example, a plug) of an external device may be electrically connected to the connector 320, and the substrate 310 may exchange signals or data with the external device via the connector 320. When signals or data are exchanged with the external device via the connector 320, an electric field is generated in the connector 320 due to a flow of a current, and this electric field may cause EMI (for example, a noise) on an area (for example, one or more signal lines or electronic components) adjacent to the connector 320. The noise occurring in the connector 320 or the PCB 300 may interrupt normal operations of the electronic device (for example, 101 of FIG. 1 or 201 of FIG. 2) (for example, degraded performance of wireless communication). According to an example embodiment, the PCB 300 may include the first ground 31001 (or B ground 31000*b*) having the same potential as that of the connector 320, and the second ground 31002 having a different potential from that of the first ground 31001 and physically isolated from the first ground 31001. According to various example embodiments, the second ground 31002 may be electrically connected with another conductive portion (for example, a portion of a housing) of the electronic device, and the grounds may be extended. When signals or data are exchanged with the external device via the connector 320, the noise occurring in the connector 320 or the PCB 300 may be distributed to the first ground 31001, the second ground 31002, or another conductive portion electrically connected with the second ground 31002, and thus may be reduced. This can enhance an electric influence by the connector 320. For example, a relatively high noise floor from among noises occurring in the connector 320 may be reduced by the second ground 31002 or another conductive portion electrically connected to the second ground 31002.

According to various example embodiments, the PCB 300 may include a ground extension member 330 electrically connected to the second ground 31002 to extend the ground.

Figure 8:
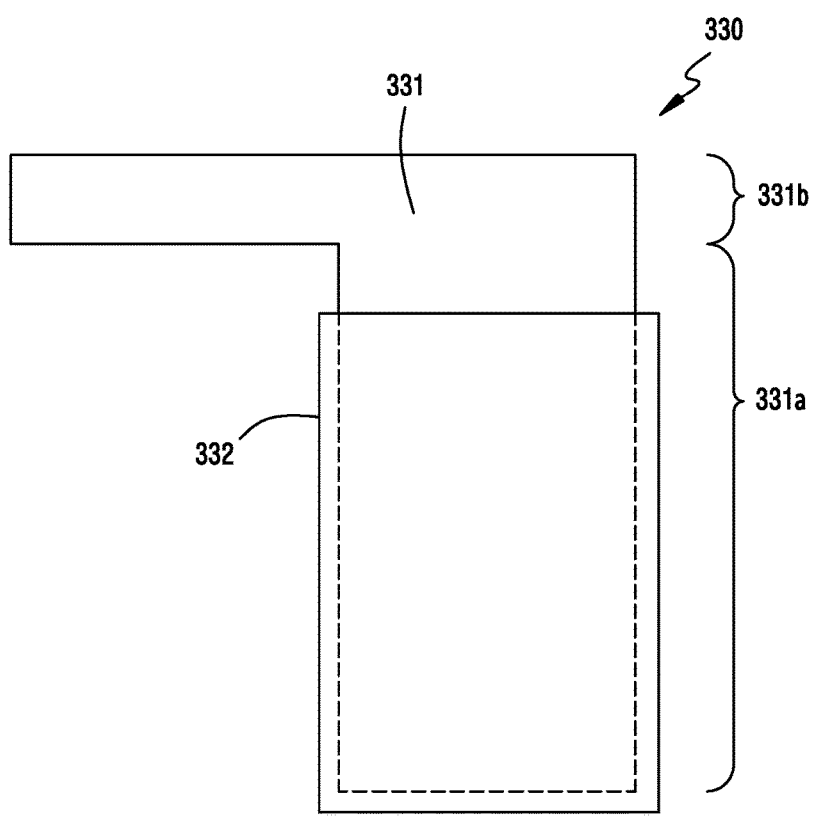
FIG. 8 is a diagram illustrating a ground extension member according to an example embodiment.
Figure 9:
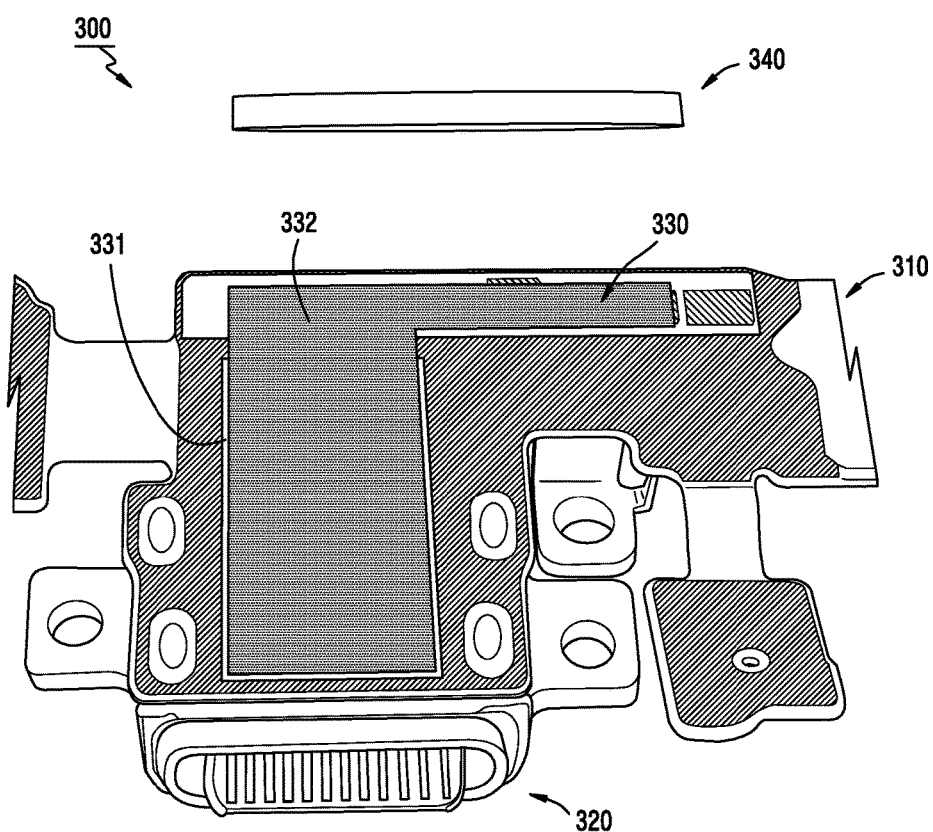
FIG. 9 is a diagram illustrating a connector, a ground extension member, and a substrate which are coupled to one another according to an example embodiment.

FIG. 8 is a diagram illustrating the ground extension member 330 according to an example embodiment. FIG. 9 is a diagram illustrating the connector 320, the ground extension member 330, and the substrate 310 which are coupled to one another according to an example embodiment. Referring to FIGS. 3, 8, and 9, the PCB 300 may include the ground extension member 330 coupled to the substrate first surface 3001. The ground extension member 330 may include a conductive member 331. According to an example embodiment, the conductive member 331 may be designed in a substantially film shape. According to various example embodiments, if a mounting space of the electronic device (for example, 101 of FIG. 1 or 201 of FIG. 2) is guaranteed, the conductive member 331 may be designed in various other shapes (not shown). The conductive member 331 may include a first conductive area 331*a* covering at least a portion of the connector installation area 3100 or the first ground 31001. The conductive member 331 may include a second conductive area 331*b* extended from the first conductive area 331*a*. The second conductive area 331*b* may cover at least a portion of the second ground 31002.

According to various example embodiments, the first conductive area 331*a* may be designed to have a size or shape to cover 30% or more of a noise emission area. The first conductive area 331*a* is illustrated as being substantially rectangular, but this should not be considered as limiting. The first conductive area 331*a* may be designed in various other shapes (not shown).

According to various example embodiments, the first conductive area 331*a* may protrude from the second conductive area 331*b* and may be extended between the first and second component holes 3101, 3102 or between the third and fourth component holes 3103, 3104. According to various example embodiments, the first conductive area 331*a* may be designed to be extended between the first and third component holes 3101, 3103 or between the second and fourth component holes 3102, 3104.

According to various example embodiments, the second conductive area 331*b* may be electrically connected with the second ground 31002. For example, the second conductive area 331*b* may be coupled to the second ground 31002 by the medium of a conductive adhesive material (for example, a conductive double-sided tape).

According to an example embodiment, the conductive member 331 may have a substantially elbow shape. According to various example embodiments, the conductive member 331 may be formed in various shapes according to a design structure of the substrate 310.

According to an example embodiment, the ground extension member 330 may include a nonconductive member 332 disposed between the first conductive area 331*a* and the substrate first surface 4001. According to various example embodiments, the nonconductive member 332 may be substantially coupled to a film, the conductive member 331, and the substrate 310. For example, the nonconductive member 332 may be coupled to the conductive member 331 or the substrate 310 by the medium of an adhesive material (for example, a double-sided tape). According to various example embodiments, if a mounting space of the electronic device (for example, 101 of FIG. 1 or 201 of FIG. 2) is guaranteed, the nonconductive member 332 may be designed in various other shapes (not shown).

The nonconductive member 332 may avoid the first conductive area 331*a* being in contact with a conductive material of the substrate 310. For example, the substrate first surface 4001 of the connector installation area 3100 may include portions (for example, a contact, a via, soldering, or a portion of the first ground 41001) including a conductive material, and the nonconductive member 332 may avoid this portion being in contact with the first conductive area 331*a*. According to various example embodiments, if a nonconductive material (for example, the first cover layer 441 of FIG. 4) is coated to cover the substrate first surface 4001, the nonconductive member 332 may be omitted.

Referring to FIG. 3, in various example embodiments, if a substrate area 3106 between the connector installation area 3100 and the second ground installation area 31002*a* is designed to avoid exposing a conductive material, the nonconductive member 332 may be designed to cover a portion of the first conductive area 331*a* as shown in the drawings. According to an example embodiment, the nonconductive member 332 is illustrated as being substantially rectangular, but this should not be considered as limiting. The nonconductive member 332 may be designed in various sizes or shapes.

The conductive member 331 may be electrically connected to the second ground 31002, and the ground may be extended. The conductive member 331 may cover at least a portion of the noise emission area, and the noise occurring in the connector 320 or the PCB 300 may be moved to the second ground 31002 through the conductive member 331. According to various example embodiments, a relatively high noise floor from among the noises occurring in the connector 320 or the PCB 300 may be moved to the second ground 31002 through the conductive member 331.

Figure 11:
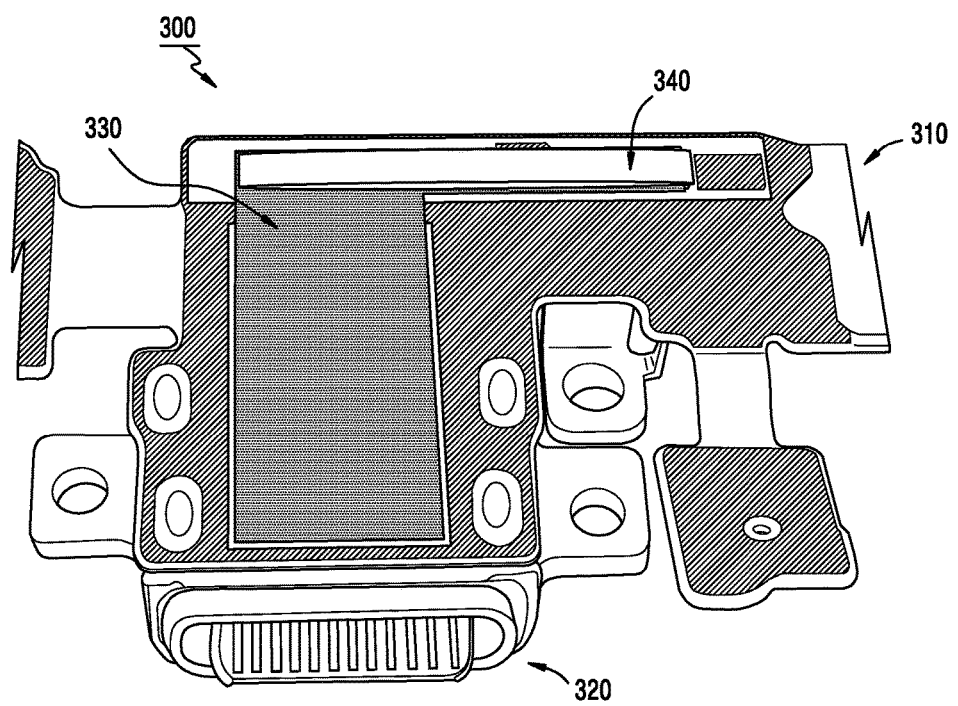
FIG. 11 is a diagram illustrating a connector, a ground extension member, a conductive connection member, and a substrate which are coupled to one another according to an example embodiment.

FIG. 11 is a diagram illustrating the connector 320, the ground extension member 330, a conductive connection member 340, and the substrate 310 which are coupled to one another according to an example embodiment. Referring to FIGS. 3 and 11, in an example embodiment, the PCB 300 may include the conductive connection member 340 for electrically connecting the second ground 31002 to another conductive portion (for example, a portion of a housing) of the electronic device (for example, 101 of FIG. 1 or 201 of FIG. 2). For example, when the PCB 300 is installed in the electronic device (for example, 101 of FIG. 1 or 201 of FIG. 2), the conductive connection member 340 electrically connected to the second ground 31002 may be electrically connected to a conductive portion (not shown) of the housing. According to an example embodiment, the conductive connection member 340 may be coupled to the second conductive area 331*b*.

According to various example embodiments, the conductive connection member 30 may include an elastic structure, which can enhance an electric connection between two members.

Figure 10:
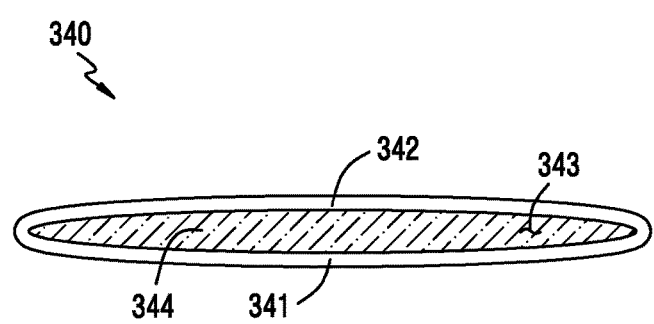
FIG. 10 is a cross-sectional view illustrating a conductive connection member according to an example embodiment.

FIG. 10 is a cross-sectional view of the conductive connection member 340 according to an example embodiment. Referring to FIGS. 10 and 11, the conductive connection member 340 may include a first metal plate 341 and a second metal plate 342, and may have an annular shape having both ends of the first metal plate 341 connected to both ends of the second metal plate 342. According to an example embodiment, the first metal plate 341 or the second metal plate 342 may be formed in a substantially curved shape, and a space 343 may be formed between the first metal plate 341 and the second metal plate 342. When the PCB 300 is installed in the electronic device (for example, 101 of FIG. 1 or 201 of FIG. 2), the first metal plate 341 may be electrically connected to the second conductive area 331*b* of the ground extension member 330, and the second metal plate 342 may be electrically connected to another conductive portion (for example, a portion of a housing) of the electronic device. When the PCB 300 is installed in the electronic device (for example, 101 of FIG. 1 or 201 of FIG. 2), the first metal plate 341 or the second metal plate 342 may be deformed with elasticity due to a gap between the second conductive area 331*b* of the ground extension member 330 and another conductive portion (for example, a portion of a housing) of the electronic device, and accordingly, the space 343 therebetween may be reduced.

According to various example embodiments, the conductive connection member 340 may further include an elastic material 344 disposed in the space 343 between the first metal plate 341 and the second metal plate 342. The elastic material 344 may enhance elasticity of the elastic structure of the conductive connection member 340. According to various example embodiments, the elastic material 344 may include a conductive material or a nonconductive material. If the elastic material 344 is conductive, the elastic material 344 may be electrically connected to the first metal plate 341 or the second metal plate 342.

According to various example embodiments, the conductive connection member 340 may include a flexible conductive member of various shapes (not shown). For example, the flexible conductive member may include a C clip 1110, a pogo-pin, a spring, conductive phorone and rubber, a conductive tape or copper connector, or etc.

According to various example embodiments, the electronic device (for example, 101 of FIG. 1 or 201 of FIG. 2) including the PCB 300 may include a communication module (for example, 220 of FIG. 2). According to various example embodiments, the electronic device including the PCB 300 may include a wireless communication device using at least one antenna. The wireless communication device may be disposed in the proximity of the connector 320 (for example, within 50 mm). According to an example embodiment, when signals or data are exchanged with an external device via the connector 320, a noise occurring in the connector 320 or the PCB 300 may be moved to another conductive portion (for example, a portion of a housing) of the electronic device (for example, 101 of FIG. 1 or 201 of FIG. 2) through the ground extension member 330 and the conductive connection member 340, and this can prevent the performance (for example, a receive sensitivity) of the wireless communication device from being degraded by the noise occurring in the connector 320 or the PCB 300.

According to an example embodiment, an external device may be connected to the connector 320 and the PCB 300 may receive power from the external device. For example, referring to FIG. 6B, the PCB 300 may receive power from the external device through the contacts A4, A9, B4, B9 of the connector 320 supporting power supply. The electronic device (for example, 101 of FIG. 1 or 201 of FIG. 2) (for example, the power management module 295 of FIG. 2) (for example, a power management integrated circuit (PMIC) or a charger IC) in which the PCB 300 is installed may charge the battery by using power received through the connector 320.

According to an example embodiment, the external device (for example, a charging device) may receive an alternating current (AC) from an AC power source, and may rectify the AC to a direct current (DC) of a relatively low low-voltage. The external device may include at least one capacitor, and the at least one capacitor may rectify the AC supplied from the AC power source to the DC of the low voltage. If the external device has a defect or at least one capacitor of the external device is broken down, the AC of the high voltage supplied from the AC power source may not be rectified to the DC of the low voltage, and may be drawn in through the connector 320. When the AC is drawn in the PCB 300 through the connector 320, the PCB 300 or at least one electronic component mounted on the PCB 300 may be broken down. The AC drawn in through the connector 320 may flow to at least one conductive portion (for example, a bezel) of the housing through the PCB 300, and this may cause an electric shock to a user carrying the electronic device. According to an example embodiment, the PCB 300 may include at least one element (for example, an active element) (not shown) electrically connected with the second ground 31002. For example, the at least one element may include a capacitor or a diode (for example, a transient voltage suppressor (TVS) diode, etc.). According to an example embodiment, the at least one element (for example, a capacitor) of the PCB 300 may convert the AC or an over current drawn in through the connector 320 to a DC of a relatively low low-voltage. The converted DC may flow to at least one conductive portion (for example, a bezel) of the housing of the electronic device (for example, 101 of FIG. 1 or 201 of FIG. 2) through the second ground 31002, the ground extension member 330, and the conductive connection member 340, and this can prevent an electric shock caused by the AC or over current drawn in through the connector 320. According to an example embodiment, the second ground 31002, the ground extension member 330, the conductive connection member 340, and the at least one conductive portion of the housing may be defined as a "ground for DC" in the PCB 300. According to various example embodiments, at least one element of the PCB 300 may block the AC or over current drawn in through the connector 320, and this can prevent an electric shock caused by the AC or over current drawn in through the connector 320.

Figure 12A:
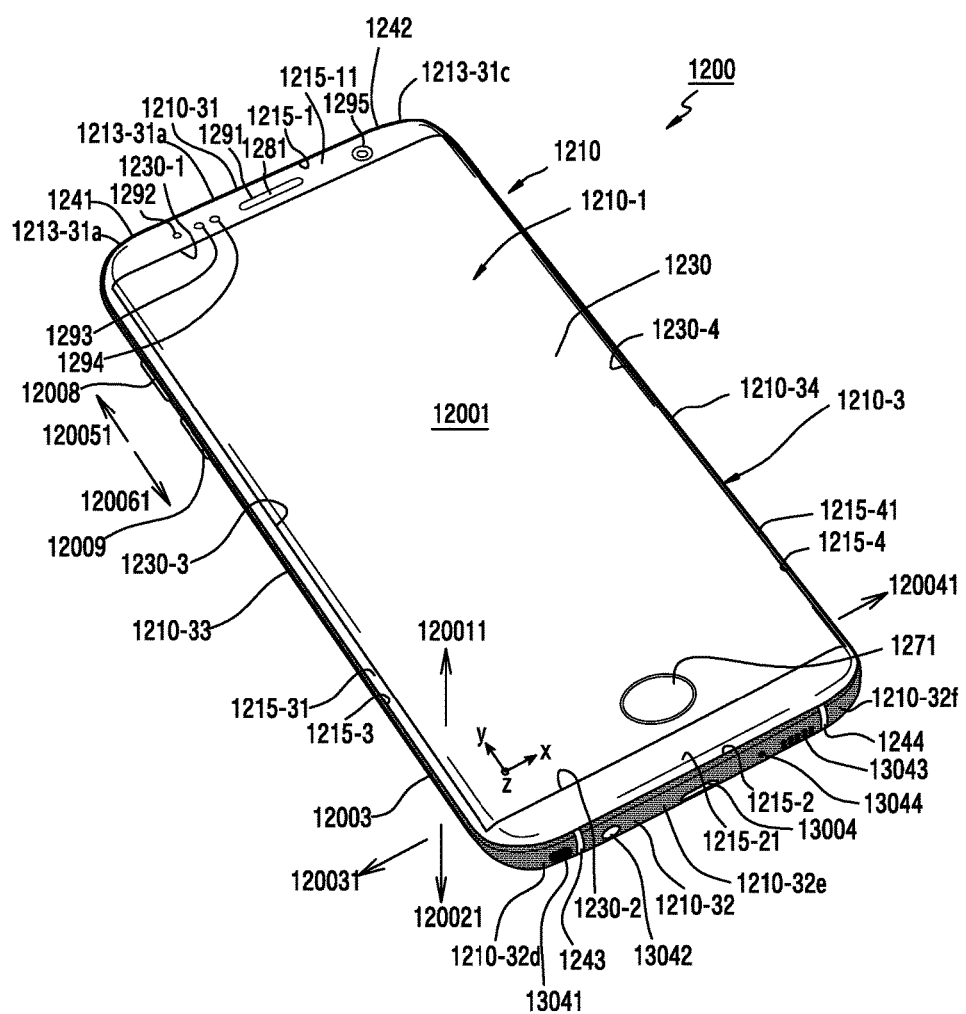
FIGS. 12A, 12B and 12C are diagrams illustrating a PCB including a connector and grounds with different potentials, and an electronic device having the same according to an example embodiment.
Figure 12B:
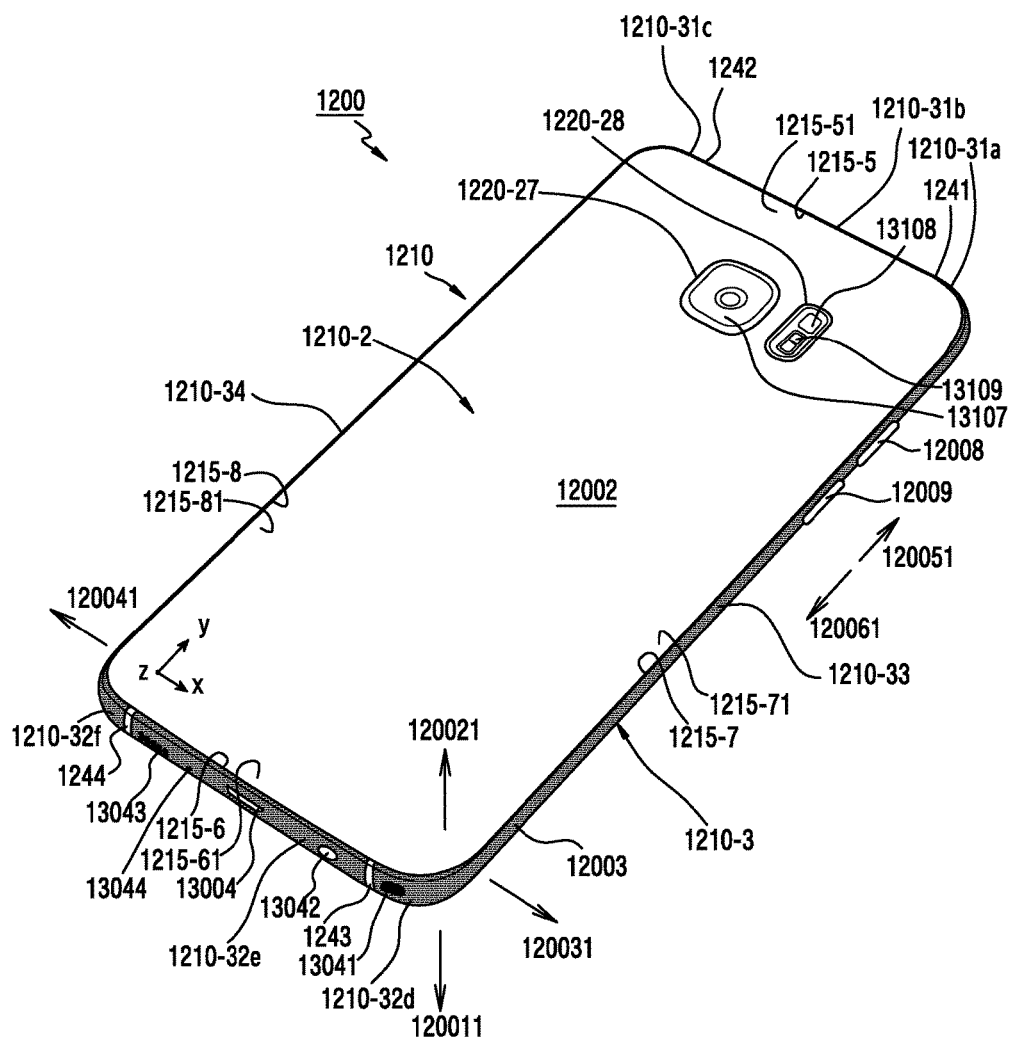
Figure 12C:
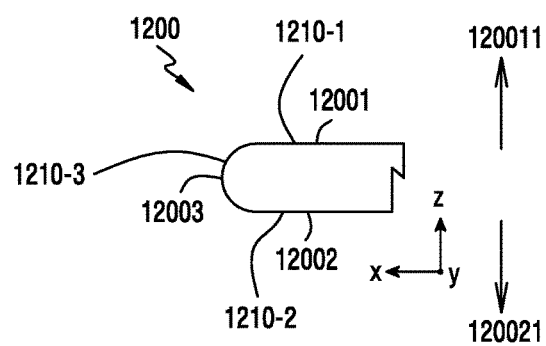
Figure 13:
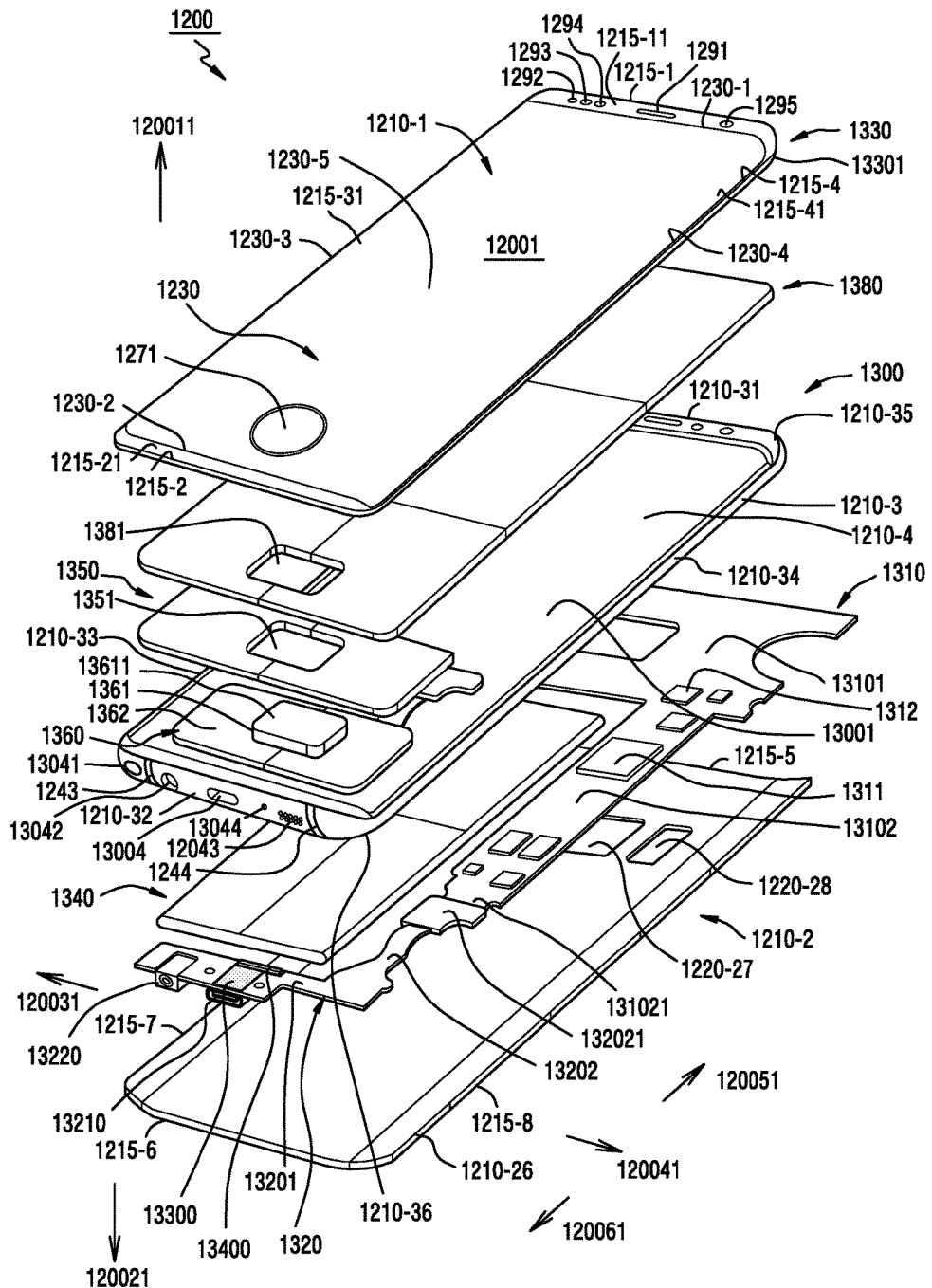
FIG. 13 is an exploded perspective view illustrating the PCB including the connector and the grounds with different potentials, and the electronic device having the same according to an example embodiment.

FIGS. 12A, 12B and 12C are diagrams illustrating a PCB including a connector and grounds with different potentials, and an electronic device including the same according to an example embodiment. FIG. 13 is an exploded perspective view illustrating the PCB including the connector and the grounds with different potentials, and the electronic device including the same according to an example embodiment. According to various example embodiments, the electronic device 1200 of FIGS. 12A to 13 may include at least a portion of the electronic device 101 of FIG. 1 or the electronic device 201 of FIG. 2.

Referring to FIGS. 12A, 12B, 12C and FIG. 13, in an example embodiment, the electronic device 1200 may include a housing 1210 forming an entirety or a portion of the exterior of the electronic device 1200. According to various example embodiments, the housing 1210 may include a nonmetallic material and/or metallic material. For example, the housing 1210 may be formed of a material such as plastic, metal, carbon fiber, and other fiber composites, ceramic, glass, wood, or a combination of these materials. According to various example embodiments, the housing 1210 may be entirely formed of one material or a combination of a plurality of materials. According to various example embodiments, the housing 1210 may be in part formed of materials having different material properties.

According to an example embodiment, the housing 1210 may form an exterior including a first surface 12001, a second surface 12002, and a third surface 12003. The first surface 12001 may face toward a first direction 120011 and the second surface 12002 may face toward a $12^{th}$ direction 120021 opposite the first direction 120011. The third surface 12003 may be a surface (for example, a side surface) surrounding a space between the first surface 12001 and the second surface 12002.

According to an example embodiment, the housing 1210 may include a first cover 1210-1 (or a first plate) forming the first surface 12001, and a second cover 1210-2 (or a second plate) forming the second surface 12002. The housing 1210 may include a side surface bezel structure 1210-3 (or a side member) surrounding a space between the first cover 1210-1 and the second cover 1210-2. The side surface bezel structure 1210-3 may form the third surface 12003.

According to an example embodiment, the first cover 1210-1 may be substantially rectangular, including a first edge 1215-1, a second edge 1215-2, a third edge 1215-3, and a fourth edge 1215-4. According to an example embodiment, a distance between the first edge 1215-1 and the second edge 1215-2 may be longer than a distance between the third edge 1215-3 and the fourth edge 1215-4. According to an example embodiment, a connection portion (not shown) of the first edge 1215-1 and the third edge 1215-3, a connection portion (not shown) of the first edge 1215-1 and the fourth edge 1215-4, a connection portion (not shown) of the second edge 1215-1 and the third edge 1215-3, or a connection portion (not shown) of the second edge 1215-2 and the fourth edge 1215-4 may be rounded.

According to an example embodiment, the second cover 1210-2 may have a substantially similar shape to the first cover 1210-1. For example, the second cover 1210-2 may be substantially rectangular, including a fifth edge 1215-5 corresponding to the first edge 1215-1, a sixth edge 1215-6 corresponding to the second edge 1215-2, a seventh edge 1215-7 corresponding to the third edge 1215-3, and an eighth edge 1215-8 corresponding to the fourth edge 1215-4.

Referring to FIGS. 12A to 13, in an example embodiment, the side surface bezel structure 1210-3 may include a first frame 1210-31 coupled between the first edge 1215-1 of the first cover 1210-1 and the fifth edge 1215-5 of the second cover 1210-2. The side surface bezel structure 1210-3 may include a second frame 1210-32 coupled between the second edge 1215-2 of the first cover 1210-1 and the sixth edge 1215-6 of the second cover 1210-2. The side surface bezel structure 1210-3 may include a third frame 1210-33 coupled between the third edge 1215-3 of the first cover 1210-1 and the seventh edge 1215-7 of the second cover 1210-2. The side surface bezel structure 1210-3 may include a fourth frame 1210-34 coupled between the fourth edge 1215-4 of the first cover 1210-1 and the eighth edge 1215-8 of the second cover 1210-2.

According to an example embodiment, a connection portion (not shown) of the first frame 1210-31 and the third frame 1210-33, a connection portion (not shown) of the first frame 1210-31 and the fourth frame 1210-34, a connection portion (not shown) of the second frame 1210-32 and the third frame 1210-33, or a connection portion (not shown) of the second frame 1210-32 and the fourth frame 1210-34 may be rounded.

According to an example embodiment, the side surface bezel structure 1210-3 may include an extension portion (for example, a mounting plate 1210-4 of FIG. 13) extended from at least one of the first frame 1210-31, the second frame 1210-32, the third frame 1210-33, and the fourth frame 1210-34 to a space (not shown) between the first cover 1210-1 and the second cover 1210-2. Referring to FIG. 13, a support structure 1300 may include a bezel 1210-3 including a first frame 1210-31, a second frame 1210-32, a third frame 1210-33, and a fourth frame 1210-34, and a mounting plate (or a mid-plate 1210-4) coupled to the bezel 1210-3.

According to an example embodiment, at least a portion of the first frame 1210-31, the second frame 1210-32, the third frame 1210-33, and the fourth frame 1210-34 of the bezel 1210-3 may include a conductive material. According to an example embodiment, at least one of the first frame 1210-31, the second frame 1210-32, the third frame 1210-33, and the fourth frame 1210-34 of the bezel 1210-3 may include a plurality of metallic portions physically isolated from one another. According to various example embodiments, a nonconductive member may be disposed between the plurality of metallic portions.

Figure 15:
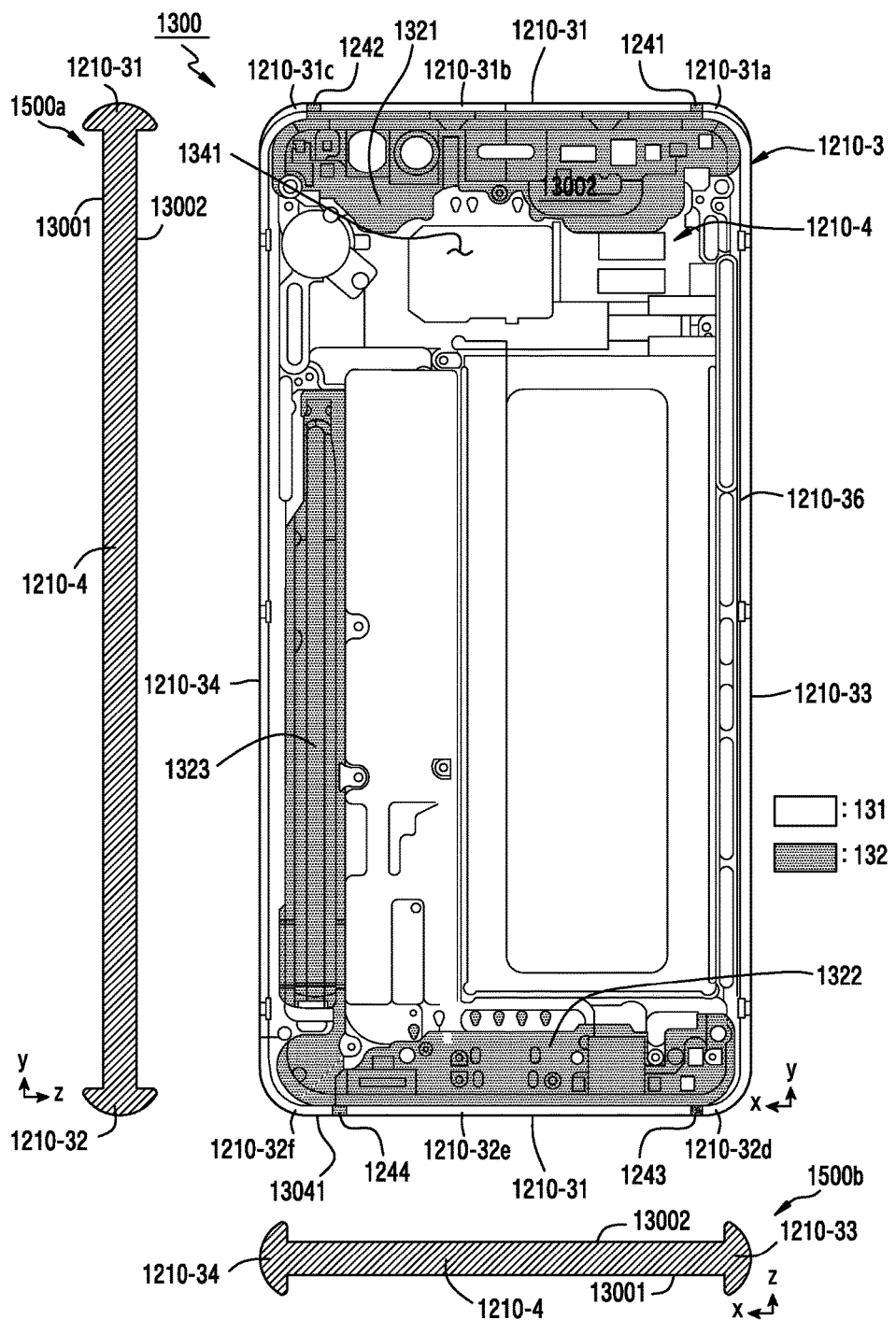
FIG. 15 is a diagram illustrating the support structure to which the PCB including the connector and the grounds with different potentials is coupled according to an example embodiment.

FIG. 15 is a diagram illustrating the support structure to which the PCB including the connector and the grounds with different potentials is coupled according to an example embodiment. Referring to FIGS. 12A, 12B, and 15, the first frame 1210-31 of the side surface bezel structure 1210-3 may include an a metal frame 1210-31*a*, a b metal frame 1210-31*b*, and a c metal frame 1210-31*c* which are physically isolated from one another. The b metal frame 1210-31*b* may be disposed between the a metal frame 1210-31*a* and the c metal frame 1210-31*c*, and the a metal frame 1210-31*a* of the first frame 1210-31 may be connected to the third frame 1210-33, and the c metal frame 1210-31*c* of the first frame 1210-31 may be connected to the fourth frame 1210-34. Accordingly, the a metal frame 1210-31*a* and the third frame 1210-33 may be integrally formed with each other by metal, and the c metal frame 1210-31*c* and the fourth frame 1210-34 may be integrally formed with each other by metal.

Referring to FIGS. 12A, 12B, and 15, in an example embodiment, the housing 1210 may include a first nonconductive member 1241 disposed between the a metal frame 1210-31*a* and the b metal frame 1210-31*b* of the side surface bezel structure 1210-3. The housing 1210 may include a second nonconductive member 1242 disposed between the b metal frame 1210-31*b* and the c metal frame 1210-31*c*. The first nonconductive member 1241 and the second nonconductive member 1242 may be seamlessly connected with the first frame 1210-31, and may form a portion of the third surface 12003 of the first housing 1210.

In an example embodiment, a first gap (not shown) between the a metal frame 1210-31*a* and the b metal frame 1210-31*b* may be a portion that is filled with the first nonconductive member 1241. A second gap (not shown) between the b metal frame 1210-31*b* and the c metal frame 1210-31*c* may be a portion that is filled with the second nonconductive member 1242. According to an example embodiment, widths of the first gap and the second gap may be the same as each other or may be different from each other.

Referring to FIGS. 12A, 12B, and 15, the second frame 1210-32 of the side surface bezel structure 1210-3 may include a d metal frame 1210-32*d*, an e metal frame 121-32*e*, and an f metal frame 1210-32*f* which are physically isolated from one another. The e metal frame 1210-32*e* may be disposed between the d metal frame 1210-32*d* and the f metal frame 1210-31*f*, and the d metal frame 1210-32*d* of the second frame 1210-32 may be connected to the third frame 1210-33 and the f metal frame 1210-32*f* of the second frame 1210-32 may be connected to the fourth frame 1210-34. Accordingly, the d metal frame 1210-32*d* and the third frame may be integrally formed with each other by metal, and the f metal frame 1210-32*f* and the fourth metal frame 1210-34 may be integrally formed with each other by metal.

Referring to FIGS. 12A, 12B, and 15, according to an example embodiment, the housing 1210 may include a third nonconductive member 1243 disposed between the d metal frame 1210-32*d* and the e metal frame 1210-32*e* of the side surface bezel structure 1210-3. The housing 1210 may include a fourth nonconductive member 1244 disposed between the e metal frame 1210-32*e* and the f metal frame 1210-32*f*. The third nonconductive member 1243 and the fourth nonconductive member 1244 may be seamlessly connected with the second frame 1210-32, and may form a portion of the third surface 12003 of the housing 1210.

According to an example embodiment, a third gap (not shown) between the d metal frame 1210-32*d* and the e metal frame 1210-32*e* may be a portion that is filled with the third nonconductive member 1243. A fourth gap (not shown) between the e metal frame 1210-32*e* and the f metal frame 1210-32*f* may be a portion that is filled with the fourth nonconductive member 1244. According to an example embodiment, widths of the third gap and the fourth gap may be the same as each other or may be different from each other.

Referring to FIGS. 12A and 13, the first surface 12001 may include a first edge area 1215-11 adjacent to (for example, within about 10 mm or less from) the first edge 1215-1, a second edge area 1215-21 adjacent to the second edge 1215-2, a third edge area 1215-31 adjacent to the third edge 1215-3, and a fourth edge area 1215-41 adjacent to the fourth edge 1215-4. According to an example embodiment, at least one of the first edge area 1215-11, the second edge area 1215-21, the third edge area 1215-31, and the fourth edge area 1215-41 may be designed to have an inclined plane. For example, the third edge area 1215-31 may be a curved surface in the form of descending in the $12^{th}$ direction 120021 with respect to coordinates increased in a direction 120031 (hereinafter, a $13^{th}$ direction) of going from the fourth frame 1210-34 to the third frame 1210-33. According to various example embodiment, the fourth edge area 1215-41 may be a curved surface in the form of descending in the $12^{th}$ direction 120021 with respect to coordinates increased in a direction 120041 (hereinafter, a $14^{th}$ direction) of going from the third frame 1210-33 to the fourth frame 1210-34. According to an example embodiment, the first surface 12001 may be designed to be substantially a flat surface.

Referring to FIGS. 12B and 13, the second surface 12002 may include a fifth edge area 1215-51 adjacent to (for example, within about 10 mm or less from) the fifth edge 1215-5, a sixth edge area 1215-61 adjacent to the sixth edge 1215-6, a seventh edge area 1215-71 adjacent to the seventh edge 1215-7, and an eighth edge area 1215-81 adjacent to the eighth edge 1215-8. According to an example embodiment, at least one of the fifth edge area 1215-51, the sixth edge area 1215-61, the seventh edge area 1215-71, and the eighth edge area 1215-81 may be designed to have an inclined plane. For example, the seventh edge area 1215-71 may be a curved surface in the form of descending in the $11^{th}$ direction 120011 with respect to coordinates increased in the $13^{th}$ direction 120031. For example, the eighth edge area 1215-81 may be a curved surface in the form of descending in the $11^{th}$ direction 120011 with respect to coordinates increased in the $14^{th}$ direction 120041. According to an example embodiment, the second surface 12002 may be designed to be substantially a flat surface.

Referring to FIGS. 12A and 12B, in various example embodiments, the third surface 12003 may be a curved surface. For example, the first frame 1210-31 may provide a side surface which is convex in a direction 120051 (hereinafter, a $15^{th}$ direction) of going from the second frame 1210-32 to the first frame 1210-31. For example, the second frame 1210-32 may provide a side surface which is convex in a direction 120061 (hereinafter, a $16^{th}$ direction) of going from the first frame 1210-31 to the second frame 1210-32. For example, the third frame 1210-33 may provide a side surface which is convex in the $13^{th}$ direction 120031. For example, the fourth frame 1210-34 may provide a side surface which is convex in the $14^{th}$ direction 120041.

According to an example embodiment, if the edge area of the first cover 1210-1 is formed in a curved shape, the edge area of the first surface 12001 (for example, the first edge area 1215-11, the second edge area 1215-21, the third edge area 1215-31, or the fourth edge area 1215-41) may have an inclined plane. According to an example embodiment, if the edge area of the second cover 1210-2 is formed in a curved shape, the edge area of the second surface 12002 (for example, the fifth edge area 1215-51, the sixth edge area 1215-61, the seventh edge area 1215-71, or the eighth area 1215-81) may have an inclined plane.

The electronic device 1200 may include various elements disposed between the first surface 12001 and the second surface 12002. Hereinafter, it will be understood that, when an A element, a B element, and a C element are mentioned as being arranged in sequence in the $12^{th}$ direction 120021, for example, the A element may be disposed on the B element and the C element may be disposed under or beneath the B element.

Referring to FIGS. 12A and 13, the electronic device 1200 may include a display 1330. According to an example embodiment, the display 1330 may include a display panel 1230 (for example, the panel 262 of FIG. 2) disposed in a space between the first cover 1210-1 and the second cover 1210-2 of the housing 1210. The display panel 1230 may include light emitters (for example, OLEDs) including a plurality of pixels, and may be exposed to the outside through the first cover 1210-1. The display panel 1230 may be disposed along at least a portion of the first cover 1210-1. According to an example embodiment, the display 1330 may be provided in such a form that the first cover 1210-1 and the display panel 1230 are coupled to each other.

The display panel 1230 may be designed to be extended along at least a portion of the first surface 12001. According to an example embodiment, the display panel 1230 may include a panel edge area (not shown) overlapping the edge area of the first surface 12001 (for example, the first edge area 1215-11, the second edge area 1215-21, the third edge area 1215-31, or the fourth edge area 1215-41). If at least one edge area of the first surface 12001 is designed to have an inclined plane, a corresponding edge area of the display panel 1230 may also be formed in a curved shape according to the inclined plane of the first surface 12001. For example, if the third edge area 1215-3 or the fourth edge area 1215-4 of the first surface 12001 is formed in a curved shape, corresponding edge areas of the first cover 1210-1 and the display panel 1230 may also be designed in a curved shape.

The display panel 1230 may include a panel a edge 1230-1 adjacent to (for example, within about 10 mm or less from) the first edge 1215-1, a panel b edge 1230-2 adjacent to the second edge 1215-2, a panel c edge 1230-3 adjacent to the third edge 1215-3, or a panel d edge 1230-4 adjacent to the fourth edge 1215-4. According to an example embodiment, a gap between the first edge 1215-1 and the panel a edge 1230-1, or a gap between the second edge 1215-2 and the panel b edge 1230-2 may be designed to be larger than a gap between the third edge 1215-3 and the panel c edge 1230-3, or a gap between the fourth edge 1215-4 and the panel d edge 1230-4.

According to various example embodiments, a portion between the first edge 1215-1 and the panel a edge 1230-1, a portion between the second edge 1215-2 and the panel b edge 1230-2, a portion between the third edge 1215-3 and the panel c edge 1230-3, or a portion between the fourth edge 1215-4 and the panel d edge 1230-4 (for example, a non-screen area) may have a color distinguished from an area (for example, a screen) covered by the display panel 1230. For example, the non-screen area may have black which is a dark color, or may have the same or similar color as or to that of the bezel 1230-3. According to an example embodiment, the non-screen area of the first cover 1210-1 may include a black printed layer.

According to an example embodiment, the display 1330 may include a first conductive pattern (not shown) disposed between a transparent substrate (for example, the first cover 1210-1) and the display panel 1230. The first conductive pattern may be used to detect a touch input or a hovering input. According to an example embodiment, the first conductive pattern may include, for example, and without limitation, aluminum (Al), copper (Cu), silver (Ag), graphene, indium-tin-oxide (ITO), indium-zinc-oxide (IZO), etc.

According to an example embodiment, the first conductive pattern may be disposed inside the display panel 1230. For example, the display panel 1230 may be an on-cell touch screen panel (TSP) AMOLED (OCTA) panel.

The electronic device 400 may include a touch/hovering input detection circuit (not shown) electrically connected to the first conductive pattern. The touch/hovering input detection circuit may activate at least a portion of the first conductive pattern, based on a signal from a control circuit (for example, the processor 120 of FIG. 1 or the processor 210 of FIG. 2). The touch/hovering input detection circuit may detect a signal related to a touch input or a hovering input through the first conductive pattern, and may provide the signal to the control circuit. The control circuit may detect a touch input or a hovering input based on a signal obtained from the touch/hovering input detection circuit. The touch input may be defined by an input occurring when an object (for example, a finger or a stylus) substantially touches the first surface 12001. The hovering input may be defined by an input occurring when an object (for example, a finger or a stylus) is spaced apart from the first surface 12001 by a threshold distance (for example, about 10 cm) or less.

According to various example embodiments, the electronic device 1200 may include a second conductive pattern (not shown) disposed along at least a portion of the first surface 12001, the second surface 12002, and the third surface 12003. According to an example embodiment, the second conductive pattern may be disposed along at least a portion of the display panel 1230. For example, the second conductive pattern may be disposed along at least a portion of a rear surface of the display panel 1230.

The electronic device 1200 may include a pressure detection circuit (not shown) electrically connected to the second conductive pattern. According to an example embodiment, the pressure detection circuit may activate at least a portion of the second conductive pattern, based on a signal from the control circuit (for example, the processor 120 of FIG. 1 or the processor 210 of FIG. 2). The pressure detection circuit may detect a signal related to a pressure through the second conductive pattern, and may provide the signal to the control circuit (for example, the processor 120 of FIG. 1 or the processor 210 of FIG. 2). For example, the second conductive pattern may include a plurality of first electrodes and a plurality of second electrodes. The plurality of first electrodes may be arranged on one layer, and the plurality of second electrodes may be arranged on another layer. According to various example embodiments, the second electrode may be provided in various forms of the electronic device 1200. For example, the second electrode may include a ground mounted in the electronic device 1200. The pressure detection circuit may apply a voltage to the plurality of first electrodes and the plurality of second electrodes, and accordingly, a capacitance may be generated between the first electrode and the second electrode. For example, when a pressure is applied to the outer surface of the electronic device 400, a distance between the first electrode and the second electrode may become shorter and the capacitance may be changed (for example, the capacitance increases). The pressure detection circuit may provide a signal according to the change in the capacitance to the control circuit. The control circuit may detect a position where the pressure is generated and a size of the pressure, based on the signal obtained from the pressure detection circuit.

According to various example embodiments, the electronic device 1200 may include a third conductive pattern (not shown) disposed along at least a portion of the first surface 12001, the second surface 12002, and the third surface 12003. According to an example embodiment, the third conductive pattern may be disposed along at least a portion of the display panel 1230. According to various example embodiments, the third conductive pattern may be designed to be disposed inside the display 1330. For example, the third conductive pattern may be disposed between the transparent substrate (for example, the first cover 1210-1) and the first conductive pattern. In another example, the third conductive pattern may be disposed between the first conductive pattern and the display panel 1230.

According to an example embodiment, the third conductive pattern may include an electrode pattern of a mesh structure. The electrode pattern of the mesh structure may be defined as a "metal mesh pattern." The metal mesh pattern may include openings. Light generated at the display panel 1230 may be discharged to the outside through the openings of the metal mesh pattern. According to various example embodiments, the metal mesh pattern may have various mesh shapes. The mesh shape may be, for example, rectangular, hexagonal, etc. According to various example embodiments, the mesh shape of the metal mesh pattern may be designed to be entirely uniform or different in part. According to various example embodiments, the mesh size of the metal mesh pattern may be designed to be entirely uniform or different in part. According to various example embodiments, thickness of the metal mesh pattern may be designed to be entirely uniform or different in part.

The electronic device 1200 may include a wireless communication circuit (for example, the communication module 220 of FIG. 2) electrically connected to the third conductive pattern. The wireless communication circuit may activate at least a portion of the third conductive pattern, based on a signal from the control circuit (for example, the processor 120 of FIG. 1 or the processor 210 of FIG. 2). The wireless communication circuit may wirelessly transmit the signal from the control circuit to the outside by using the third conductive pattern. The wireless communication circuit may receive a radio signal from the outside by using the third conductive pattern, and may provide the radio signal to the control circuit.

According to an example embodiment, the electronic device 1200 may include various electronic components (hereinafter, a "first component") mounted on aligned positions between the first edge 1215-1 and the panel a edge 1230-1 (for example, an area including the first edge area 1215-11).

Referring to FIGS. 12A and 13, in various example embodiments, the first component may include a receiver 1281 to output a voice signal received from a device of the other person on the line as a sound. The display 1330 (or the first cover 1210-1) may include a penetrating hole 1291 formed on a position aligned with the receiver 1281. The receiver 1281 may be coupled to the penetrating hole 1291.

Referring to FIGS. 12A and 13, according to various example embodiments, the first component may include at least one camera (for example, a front facing camera) (for example, the camera module 291 of FIG. 2). The display 1330 (or the first cover 1210-1) may include a light transmitting area or a penetrating hole 1295 formed on a position aligned with the at least one camera.

According to various example embodiment, the first component may include at least one sensor (for example, the sensor module 240 of FIG. 2). For example, the first component may be at least one optical sensor (for example, the illuminance sensor 240K, the RGB sensor 240H, the UV sensor 240M, the proximity sensor 240G, or the gesture sensor 240A of FIG. 2, etc.). Referring to FIGS. 4A and 5, the display 1330 (or the first cover 1210-1) may include one or more light transmitting areas or penetrating holes 1293, 1294 formed on positions aligned with the at least one optical sensor.

According to various example embodiments, the electronic device 1200 may include optical sensors (not shown) mounted on various other positions. For example, the optical sensor may support biometric detection (for example, iris recognition, skin moisture detection, skin melanin detection, skin temperature detection, or the like). According to various example embodiments, the optical sensors may include a spectrum sensor.

According to various example embodiments, at least one optical sensor may be disposed along at least a portion of a rear surface of the display 1330 (or the display panel 1230) although it is not illustrated. For example, if the at least one optical sensor is disposed on the rear surface of the display 1330, the display panel 1230 may be extended to the first edge area 1215-11 or one or more light transmitting areas or penetrating holes 1293, 1294 shown in FIGS. 12A and 13 may be omitted.

According to various example embodiments, the first component may include a light emitting element (for example, an LED) (not shown) indicating various states of the electronic device 1200. For example, when a remaining capacity of the battery is low, the electronic device 1200 may display a corresponding color through the light emitting element. For example, when a screen is turned off, the electronic device 1200 may display a corresponding color through the light emitting element. For example, when the electronic device 1200 is connected to a wired charger or a wireless charger, the electronic device 1200 may display a corresponding color through the light emitting element. Referring to FIGS. 12A and 13, the display 1330 (or the first cover 1210-1) may include a light transmitting area or a penetrating hole formed on a position aligned with the light emitting element. According to various example embodiments, if the electronic device 1200 is designed to display various states of the electronic device 1200 through the display 1330, the light emitting element and the light transmitting area or penetrating hole 1292 therefor may be omitted.

In various example embodiments, referring to FIGS. 12A and 13, the penetrating hole 1291 for the receiver 1281 may be disposed between the light transmitting areas 1293, 1294 for at least one sensor and the light transmitting area or penetrating hole 1295 for the camera, when viewed in the $12^{th}$ direction 120021. According to various example embodiments, the light transmitting areas 1293, 1294 for the at least one sensor may be disposed between the light transmitting area 1292 for the light emitting element and the penetrating hole 1291 for the receiver 1281 when viewed in the $12^{th}$ direction 120021.

According to various example embodiments, if the panel a edge 1230-1 is further extended toward the first edge 1215-1, an installation structure of the first component may be changed, although it is not illustrated. For example, the receiver may be mounted in the proximity of the rear surface of the display 1330. According to various example embodiments, the penetrating hole for discharging the sound of the receiver may be formed on the first frame 1210-31. According to various example embodiments, the first frame 1210-31 may include a recess formed on a portion adjacent to the first edge 1215-1 of the first cover 1210-1. When the first cover 1210-1 and the first frame 1210-31 are coupled to each other, the recess may be used as a hole for the receiver. According to various example embodiments, the display 1330 may include a penetrating hole for the receiver. According to various example embodiments, a bone conductive receiver may be mounted in the electronic device 1200. If the the bone conductive receiver is installed, the penetrating hole for discharging the sound from the receiver may be omitted. In another example, the position of the front facing camera may be changed. According to various example embodiment, the front facing camera may be installed to be aligned with a light transmitting area or a penetrating hole formed on the second edge area 1215-21.

Referring to FIGS. 12A and 13, according to an example embodiment, the electronic device 1200 may display a software home button 1271 through the display panel 1230. The control circuit (for example, the processor 120 of FIG. 1 or the processor 210 of FIG. 2) may display the software home button 1271 in the proximity of (for example, within 20 mm from) the panel b edge 1230-2. The control circuit may display the software home button 1271 in the middle between the panel c edge 1230-3 and the panel d edge 1230-4. According to various example embodiment, the control circuit may display the software home button 1271 on various other positions although it is not illustrated.

According to various example embodiments, the control circuit may determine a display position of the software home button 1271 according to user environment setting (user preference), an executed application (or mode), etc.

According to various example embodiments, the control circuit may determine a display position of the software home button 1271 according to a user's using hand (for example, left hand or right hand) in one handed mode (for example, a state in which the user carries the electronic device 1200 with one hand). It may be determined whether the user carries the electronic device 1200 with one hand, based at least in part on information from at least one sensor (for example, the sensor module 240 of FIG. 2). According to various example embodiments, the one handed mode may be selectively executed according to a user's input, an executed application, etc. According to various example embodiments, the electronic device 1200 may be designed to allow the user to select the hand (for example, left hand or right hand) to use when setting the one handed mode. According to various example embodiments, the electronic device 1200 may be designed to allow the user to select a position in which the user can easily select the software home button 1271 with user's thumb while carrying the electronic device 1200 with one hand. According to various example embodiments, a shape or a size of the software home button 1271 may be set variously according to a user input, a state of an executed application, etc.

When the software home button 1271 is selected by a touch input or a hovering input, the control circuit (for example, the processor 120 of FIG. 1 or the processor 210 of FIG. 2) may display a main home screen through the display panel 1230. The main home screen may be the first screen that is displayed on the display panel 1230 when the power of the electronic device 1200 is turned on. When a plurality of home screens are provided in the form of togglable pages, the main home screen may include icons for executing applications, time, weather, etc. According to various example embodiments, the home screen may display a state of the electronic device 1200 such as a battery charging state, an intensity of a received signal, or a current time. According to another example embodiment, when the software home button 1271 is selected, the control circuit may allow the electronic device 1200 to enter a sleep mode or a low-power mode. In the sleep mode or the low-power mode, the control circuit may perform only set basic operations, such as periodically listening to a radio signal from the outside. In the sleep mode or the low-power mode, the control circuit may include an operation of inactivating at least one element (for example, the display 1330). The sleep mode or the low-power mode may include an operation of inactivating at least a portion of the control circuit. According to various example embodiments, when the software home button 1271 is selected, the control circuit may convert the sleep mode or the low-power mode into a wake-up mode. For example, in the wake-up mode, the control circuit may activate the display 1330.

According to various example embodiments, when the main home screen is displayed through the display panel 1230, the control circuit (for example, the processor 120 of FIG. 1 or the processor 210 of FIG. 2) may not display the software home button 1271. According to various example embodiments, the software home button 1271 may be selectively displayed according to user environment setting, an application execution environment, etc.

According to various example embodiments, the control circuit (for example, the processor 120 of FIG. 1 or the processor 210 of FIG. 2) may activate only a portion of the display panel 430, and may display the software home button 1271 through the activated area. For example, when the software home button 1271 is selected, the control circuit may convert the other area of the display panel 1230 into an activation state.

When the software home button 1271 is selected by a touch input or a hovering input, the control circuit (for example, the processor 120 of FIG. 1 or the processor 210 of FIG. 2) may be designed to perform a function related to the software home button 1271, based on a signal generated from the pressure sensor on a position aligned with the software home button 1271. According to an example embodiment, the pressure sensor may be included in a force touch panel 1350 of FIG. 13. According to another example embodiment, at least a portion of the second conductive pattern included in the display 1330 on a position aligned with the software home button 1271 may be designed as a pressure sensor, although it is not illustrated.

According to various example embodiments, the electronic device 1200 may be designed to display various other buttons as well as the software home button 1271 through the display panel 1230. For example, the control circuit (for example, the processor 120 of FIG. 1 or the processor 210 of FIG. 2) may display a button for multitasking of various functions or a button for canceling in the proximity of the software home button 1271, although they are not illustrated.

According to various example embodiments, if a portion between the second edge 1215-2 and the panel b edge 1230-2 is designed to be extended, the electronic device 1200 may include various electronic components (hereafter, a "second component") mounted on aligned positions between the second edge 1215-2 and the panel b edge 1230-2. According to an example embodiment, the second component may include a hardware home button (not shown). The hardware home button may be substituted for the software home button.

According to various example embodiments, the control circuit (for example, the processor 120 of FIG. 1 or the processor 210 of FIG. 2) may always activate an area (for example, an area adjacent to the panel a edge 1230-1) of the display panel 1230, and may display clock, calendar, schedule, user preference information, etc. through this area (for example, an always on display (AOD) function).

According to various example embodiments, the control circuit (for example, the processor 120 of FIG. 1 or the processor 210 of FIG. 2) may receive data from an external device through an external port (for example, 13210 of FIG. 13), and may display the data through the display 1330.

Referring to FIG. 13, in an example embodiment, the electronic device 1200 may include a digitizer panel 1380 disposed under or beneath the display 1330. The digitizer panel 1380 may support a touch input or a hovering input using a stylus. According to various example embodiments, the digitizer panel 1380 may be disposed along at least a portion of the screen (or the display panel 1230). According to an example embodiment, the digitizer panel 1380 may have a rectangular plate shape having a size to overlap a rectangular area 1230-5 between the panel c edge 1230-3 and the panel d edge 1230-4 of the display panel 1230. According to various example embodiments, the digitizer panel 1380 may be extended to overlap the edge areas (not shown) of the curved shapes of the display panel 1230, and its extended portions may also be designed to have a curved shape.

According to various example embodiments, the digitizer panel 1380 may be designed to have flexibility. For example, the digitizer panel 1380 may be designed in the form of an FPCB.

Referring to FIG. 13, in an example embodiment, the electronic device 1200 may include the force touch panel 1350 disposed under or beneath the digitizer panel 1380. The force touch panel 1350 may be aligned under or beneath the position where the software home button 1271 is displayed, and may have a size to overlap a portion of the digitizer panel 1380 or the display 1330.

When an external force is applied at the position where the software home button 1271 is displayed in the $12^{th}$ direction 120021, the force touch panel 1350 may generate a signal related to a pressure. According to an example embodiment, the force touch panel 1350 may include a plurality of first electrodes and a plurality of second electrodes. The plurality of first electrodes may be arranged on a first layer, and the plurality of second electrodes may be arranged on a second layer under or beneath the first layer. The pressure detection circuit (not shown) may apply a voltage to the plurality of first electrodes and the plurality of second electrodes, and accordingly, a capacitance may be generated between the first electrode and the second electrode. When the user applies a pressure to the portion where the software home button 1271 is displayed with his/her finger, a distance between the first electrode and the second electrode becomes shorter and the capacitance may be changed (for example, the capacitance increases). The pressure detection circuit may provide a signal related to the change in the capacitance to the control circuit (for example, the processor 120 of FIG. 1 or the processor 210 of FIG. 2). The control circuit may obtain a size of the pressure applied to the position where the software home button 1271 is displayed, based on the signal obtained from the pressure detection circuit. The control circuit may perform a function related to the software home button 1271, based on the size of the pressure.

According to an example embodiment, when an external force is applied to the position where the software home button 1271 is displayed, a local portion of the display 1330 to which the external force is applied is deflected toward the $12^{th}$ direction 120021, and may presses the force touch panel 1350. According to various example embodiments, the display 1330 may include the first cover 1210-1, and a plurality of layers (for example, a polarization layer, the display panel 1230, an embo/cushion layer, etc.) arranged under or beneath the first cover 1210-1, and at least one of the plurality of layers may be designed to have flexibility. If at least a portion of the layers of the display 1330 is designed to have flexibility, the external force applied to the position where the software home button 1271 is displayed may cause a portion of the display 1330 to be deflected and thus may press the force touch panel 1350.

According to various example embodiments, the control circuit (for example, the processor 120 of FIG. 1 or the processor 210 of FIG. 2) may activate a vibrator (for example, the motor 298 of FIG. 2) based on a signal related to the pressure, obtained from the force touch panel 1350. For example, when the signal related to the pressure, obtained from the force touch panel 1350, is greater than or equal to a threshold, the control circuit may activate the vibrator.

According to an example embodiment, when a touch input or a hovering input of selecting the software home button 1271 is detected, the control circuit (for example, the processor 120 of FIG. 1 or the processor 210 of FIG. 2) may activate the force touch panel 1350 to obtain a signal related to the pressure.

According to various example embodiments, the software home button 1271 may be limited to a role of informing the position of the force touch panel 1350, and, when the touch input or hovering input of selecting the software home button 1271 is detected, the control circuit (for example, the processor 120 of FIG. 1 or the processor 210 of FIG. 2) may invalidate the touch input or the hovering input.

According to various example embodiments, the electronic device 1200 may be designed to include a hardware home button installed on the force touch panel 1350 in replacement of the software home button 1271, although it is not illustrated. The display 1330 may include a penetrating hole (not shown) for the hardware home button, and the hardware home button may be coupled to the penetrating hole of the display 1330.

According to various example embodiments, if a portion between the second edge 1215-2 and the panel b edge 1230-3 is designed to be extended, the electronic device 1200 may include the second component mounted on an aligned position between the second edge 1215-2 and the panel b edge 1230-2, although it is not illustrated. According to an example embodiment, the second component may include the hardware home button (not shown) to be substituted for the software home button 1271.

Referring to FIG. 13, the electronic device 1200 may include a fingerprint recognition sensor 1360 disposed under or beneath the display 1330. The fingerprint recognition sensor 1360 may be aligned under or beneath the position where the software home button 1271 is displayed. When the user brings a finger into contact with the position (or area) where the software home button 1271 is displayed, the fingerprint recognition sensor 1360 may generate an electric signal related to fingerprint information. According to an example embodiment, the fingerprint recognition sensor 1360 may include an optical sensor 1361. The optical sensor 1361 may include a light receiver and a light emitter (not shown). The light emitter may output light of a corresponding wavelength band related to fingerprint recognition. The light receiver may receive light of a corresponding wavelength band related to fingerprint recognition. For example, the light of the fingerprint recognition-related wavelength band, emitted from the light emitter, may be discharged to the outside through the area where the software home button 1271 is displayed, and may be transmitted to the finger covering the software home button 1271, and at least a portion of light (or light energy or light signal) scattered or reflected from the finger may enter the light receiver. The light receiver may generate an electric signal (or a detection value) related to the fingerprint, based on the scattered or reflected light, and may transmit the electric signal to the control circuit (for example, the processor 120 of FIG. 1 or the processor 210 of FIG. 2).

According to an example embodiment, an area of the display 1320 where the software home button 1271 is displayed, or the entire area of the display 1330 may be designed to include a light transmitting material.

The optical sensor 1361 of the fingerprint recognition sensor 1360 may be disposed on the rear surface of the display 1330. According to an example embodiment, the fingerprint recognition sensor 1360 may include a panel 1362. The optical sensor 1361 may be coupled to the panel 1362. The panel 1362 may include fingerprint recognition-related components or signal lines (for example, electric lines) electrically connected with the optical sensor 1361, and may be electrically connected to the PCB (for example, a first PCB 1310). The digitizer panel 1380 may include a penetrating hole 1381 formed on a position aligned with the optical sensor 1361. The force touch panel 1350 may include a penetrating hole 135 formed on a position aligned with the optical sensor 1361. The panel 1362 of the fingerprint recognition sensor 1360 may be disposed under or beneath the force touch panel 1350, and the optical sensor 1361 of the fingerprint recognition sensor 1360 may be inserted into the penetrating hole 1351 of the force touch panel 1350 and the penetrating hole 1381 of the digitizer panel 1380, and an upper end 13611 of the optical sensor 1361 may be disposed in the proximity of the rear surface of the display 1330.

According to an example embodiment, when a touch input or a hovering input of selecting the software home button 1271 is detected, the control circuit (for example, the processor 120 of FIG. 1 or the processor 210 of FIG. 2) may activate the fingerprint recognition sensor 1360 to obtain a signal related to a fingerprint.

According to an example embodiment, when an intensity of a pressure obtained using the force touch panel 1350 is greater than or equal to a threshold, the control circuit (for example, the processor 120 of FIG. 1 or the processor 210 of FIG. 2) may activate the fingerprint recognition sensor 1360 to obtain a signal related to a fingerprint.

According to various example embodiments, the software home button 1271 may merely have a role for informing the position of the optical sensor 1361 of the fingerprint recognition sensor 1360, and, when a touch input or a hovering input of selecting the software home button 1271 is detected, the control circuit (for example, the processor 120 of FIG. 1 or the processor 210 of FIG. 2) may invalidate the touch input or the hovering input.

Figure 14:
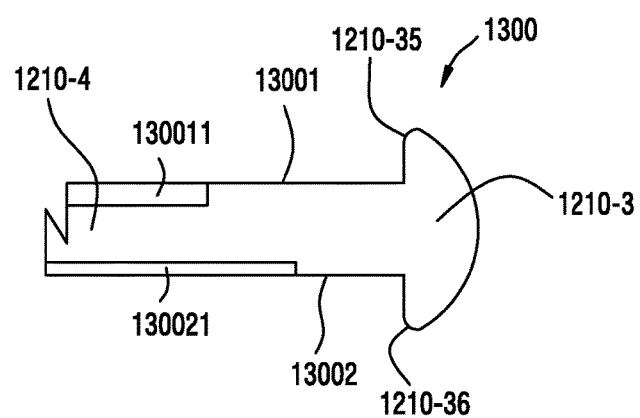
FIG. 14 is a cross-sectional view illustrating a support structure to which the PCB including the connector and the grounds with different potentials is coupled according to an example embodiment.

FIG. 14 is a cross-sectional view illustrating the support structure 1300 to which the PCB including the connector and the grounds with different potentials is coupled according to an example embodiment. FIG. 15 illustrates the support structure 1300 to which the PCB including the connector and the grounds with different potentials is coupled according to an example embodiment. Referring to FIGS. 13 to 15, the support structure 1300 may include the side surface bezel structure 1210-3 and the mounting plate 1210-4 (or the mid-plate). The side surface bezel structure 1210-3 may have a substantially rectangular ring shape, including the first frame 1210-31, the second frame 1210-32, the third frame 1210-33, and the fourth frame 1210-34. The mounting plate 1210-4 may be a plate of a shape extended from the frames 1210-31, 1210-32, 1210-33, or 1210-34 inward the side surface bezel structure 1210-3. Referring to FIG. 15, the support structure 1300 may be designed to have a substantially H-shaped cross-sectional structure in cross section view (1500a, 1500b), and this may enhance a dynamic property of the support structure 1300 such as torsional rigidity. When elements such as the display 1330, the PCB 1310, 1320, etc. are coupled to the support structure 1300, the electronic device 400 may have enhanced durability.

Referring to FIGS. 13 to 15, in an example embodiment, the support structure 1300 may include a first installation surface 13001 that substantially faces toward the 11$^{th}$ direction 120011 and a second installation surface 13002 that faces toward the 12$^{th}$ direction 120021. Referring to FIG. 13, the first installation surface 13001 of the support structure 1300 may include a bezel upper edge 1210-35 formed along the frames (for example, the first frame 1210-31, the second frame 1210-32, the third frame 1210-33 or the fourth frame 1210-34) of the side bezel structure 1210-3. A display edge 13301 of the display 1330 may be coupled to the bezel upper edge 1210-35, and a space for mounting the digitizer panel 1380, the force touch panel 1250, and the fingerprint recognition sensor 1360 may be formed between the display 1330 and the support structure 1300.

Referring to FIGS. 13 to 15, the second installation surface 13002 of the support structure 1300 may include a bezel lower edge (for example, 1210-36 of FIG. 15) formed along the frames (for example, the first frame 1210-31, the second frame 1210-32, the third frame 1210-33, or the fourth frame 1210-34) of the side surface bezel structure 1210-3. A second cover edge 1210-26 of the second cover 1210-2 may be coupled to the bezel lower edge 1210-36, and a space for mounting other electronic components (for example, the PCB 1310, 1320, the battery 1340 (or battery pack), etc.) may be formed between the second cover 1210-2 and the support structure 1300.

According to various example embodiments, the side surface bezel structure 1210-3 may be integrally formed with the second cover 1210-2 although it is not illustrated.

Referring to FIG. 14, the first installation surface 13001 or the second installation surface 13002 may include recesses 130011, 130021 or ribs of various shapes for fitting or supporting elements.

Figure 16:
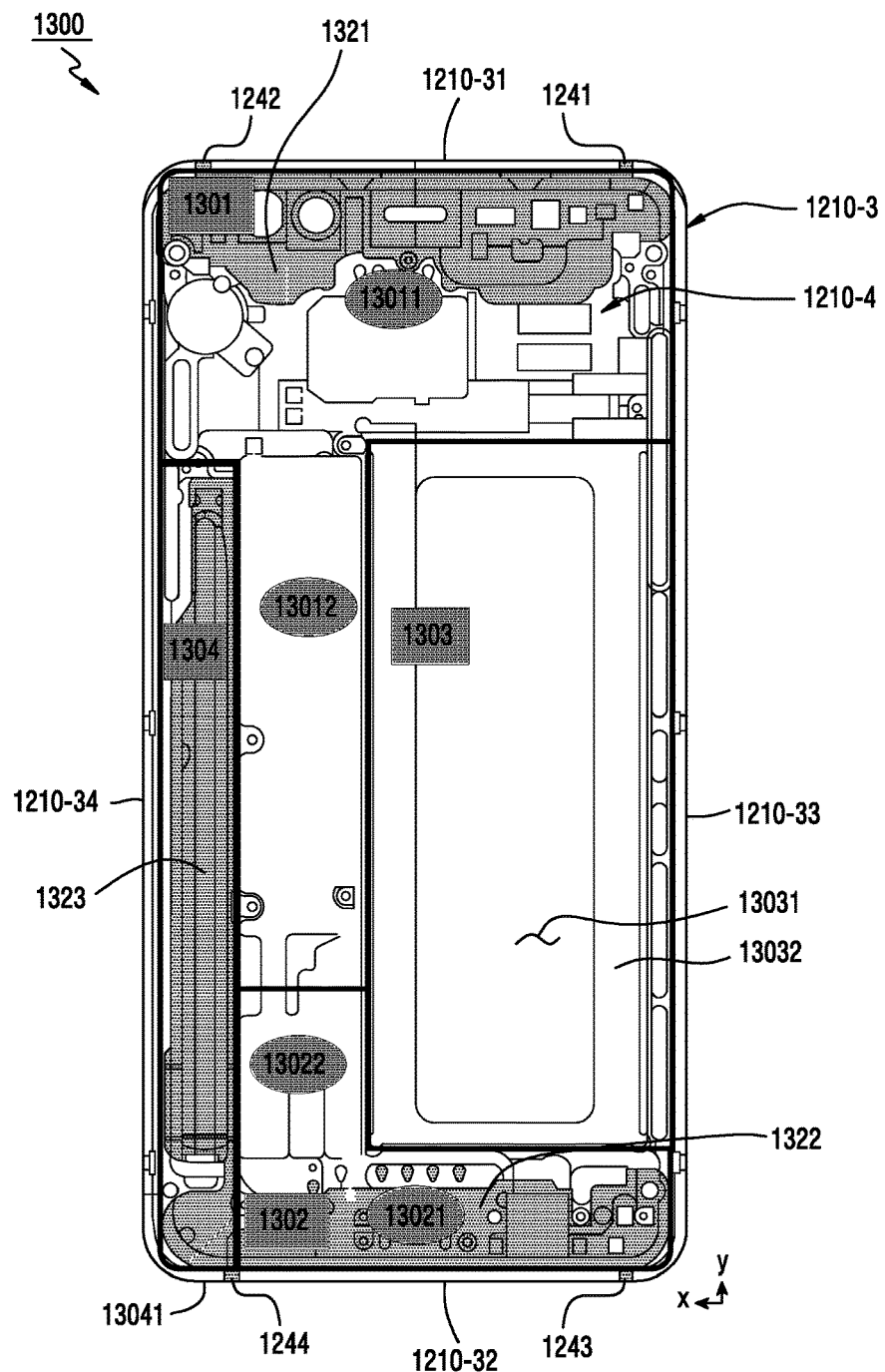
FIG. 16 is a diagram illustrating the support structure to which the PCB including the connector and the grounds with different potentials is coupled according to an example embodiment.

According to various example embodiments, the second installation surface 13002 of the support structure 1300 may include a plurality of installation portions for installing elements. FIG. 16 illustrates the support structure to which the PCB including the connector and the grounds with different potentials is coupled according to an example embodiment. Referring to FIG. 16, the second installation surface 13002 may include a first installation portion 1301 to which the first PCB 1310 is coupled. The second installation surface 13002 may include a second installation portion 1302 to which a second PCB 1320 is coupled. The second installation portion 13002 may include a third installation portion 1303 to which the battery 1340 is coupled.

The battery 1340 may be coupled to the third installation portion 1303 by using bolt screwing, an adhesive member, etc., and may be designed as an element that should not be separated from the electronic device 1200. The battery 1340 may be forcedly separated from the electronic device 1200, but this is not classified as a "removable" element. According to various example embodiments, the third installation portion 1303 may include a penetrating portion 13031. The battery 1340 may be seated on a peripheral area 13032 of the penetrating portion 13031.

According to various example embodiments, the battery 1340 may be designed as a "removable" element. For example, the battery 1340 may be coupled to the third installation portion 1303 without using bolt screwing, an adhesive member, etc. (for example, fitting). When the second cover 1310-2 is separated from the electronic device 1200, the battery 1340 may be separated from the electronic device 1200.

According to various example embodiments, the second installation surface 13002 may include a fourth installation portion 1304 to which a stylus (not shown) is coupled from the electronic device 1200. The electronic device 1200 may include a penetrating hole (for example, 13041 of FIG. 12A, 12B, 13, 15, or 16) formed on the second frame 1210-32. The penetrating hole 13041 may be connected to the fourth installation portion 1304, and may be used as an exit and entrance for removing the stylus.

Referring to FIG. 16, the third installation portion 1303 may be disposed in the proximity of the third frame 1210-33, and may be substantially rectangular when viewed in the 11$^{th}$ direction (for example, 120011 of FIG. 13). The fourth installation portion 1304 may be disposed in the proximity of the fourth frame 1210-34, and may be substantially rectangular when viewed in the 11$^{th}$ direction (for example, 120011 of FIG. 13).

Referring to FIG. 16, in an example embodiment, the first installation portion 1301 may include a 1-1 installation portion 13011 and a 1-2 installation portion 13012. The 1-2 installation portion 13012 may protrude from the 1-1 installation portion 13011 and may be extended between the third installation portion 1303 and the fourth installation portion 1304. The 1-1 installation portion 13011 may be an area that is surrounded by the first frame 1210-31, a portion of the fourth frame 1210-34 connected to the first frame 1210-31, the fourth installation portion 1304, the 1-2 installation portion 13012, the third installation portion 1303, and a portion of the third frame 1210-33 connected to the first frame 1210-31. According to an example embodiment, the first installation portion 1301 may have a substantially "T" shape.

Referring to FIG. 16, in an example embodiment, the second installation portion 1302 may include a 2-1 installation portion 13021 and a 2-2 installation portion 13022. The 2-2 installation portion 13022 may be extended from the 2-1 installation portion 13021 between the third installation portion 1303 and the fourth installation portion 1304. The 2-1 installation portion 13021 may be an area that is surrounded by a portion of the second frame 1210-32, a portion of the third frame 1210-33 connected to the second frame 1210-32, the third installation portion 1303, the 2-2 installation portion 13022, and the fourth installation portion 1304. According to an example embodiment, the second installation portion 1302 may have a substantially "L" shape.

According to an example embodiment, if the electronic device 1200 is designed not to include the fourth installation portion 1304, the first installation portion 1301 or the second installation portion 1302 may be extended to at least a portion of the fourth installation portion 1304.

The first installation portion 1301 may include an area for installing the first PCB 1310, and also, may include an area for installing other elements electrically connected to the electronic device 1200 (or the first PCB 1310). The second installation portion 1302 may include an area for installing the second PCB 1320, and also, may include an area for installing other elements electrically connected to the electronic device 1200 (or the second PCB 1320). The third installation portion 1303 may include an area for installing the battery 1340, and also, may include an area for installing other elements. The fourth installation portion 1304 may include an area for installing the stylus, and also, may include an area for installing other elements.

At least a portion of the side surface bezel structure 1210-3 may include a metallic material or a nonmetallic material. According to an example embodiment, the first frame 1210-31 may include the a metal frame 1210-31a, the b metal frame 1210-31b, and the c metal frame 1210-31c. The first frame 1210-31 may include the first conductive member 1241 disposed between the a metal frame 1210-31a and the b metal frame 1210-31b, or the second conductive member 1242 disposed between the b metal frame 1210-31b and the c metal frame 1210-31c. According to an example embodiment, the second frame 1210-32 may include the d metal frame 1210-31d, the e metal frame 1210-31e, and the f metal frame 1210-31f. The second frame 1210-32 may include the third conductive member 1243 disposed between the d metal frame 1210-31d and the e metal frame 1210-31e, or the fourth conductive member 1244 disposed between the e metal frame 1210-31e and the f metal frame 1210-31f. According to an example embodiment, the third frame 1210-33 or the fourth frame 1210-34 may include a metallic material. According to an example embodiment, the second ground (for example, 41002 of FIG. 4) of the second PCB 1320 may be electrically connected to the third frame 1210-33 or the fourth frame 1210-34, and the ground may be extended.

Referring to FIG. 15, at least a portion of the mounting plate 1210-4 may include a metallic material or a nonmetallic material. According to an example embodiment, the mounting plate 1210-4 may include a conductive area 131 extended from at least a portion of the a metal frame 1210-31a, the b metal frame 1210-31b, the c metal frame 1210-31c, the d metal frame 1210-31d, the e metal frame 1210-31e, and the f metal frame 1210-31f of the side surface bezel structure 1210-3. According to various example embodiments, the conductive area 131 may form at least a portion of the first installation surface 13001 or the second installation surface 13002. According to an example embodiment, the second ground (for example, 41002 of FIG. 4) of the second PCB 1320 may be electrically connected to the conductive area 131 of the mounting plate 1210-4, and the ground may be extended. Referring to FIG. 15, the mounting plate 1210-4 may include a nonconductive area 132 coupled to the conductive area 131 of the side surface bezel structure 1210-3. According to an example embodiment, the nonconductive area 132 may be formed by removing a portion of a metal plate for the conductive area 131 and coupling a nonmetallic material to the removed portion. For example, the nonconductive area 132 may be formed by forming a recess (not shown) dented on the metal plate for the conductive area 131 in the $11^{th}$ direction (for example, 120011 of FIG. 12A) or the $12^{th}$ direction (for example, 120021 of FIG. 12A), and then coupling a nonmetallic material to the recess. For example, the nonconductive area 132 may be formed by coupling a nonmetallic material to a penetrating portion (not shown) penetrating between the first installation surface 13001 and the second installation surface 10032 on the metal plate for the conductive area 131. The nonconductive area 132 may form at least a portion of the first installation surface 13001 or the second installation surface 13002.

The nonconductive area 132 may be formed on a position for covering at least one electronic component (not shown) of the electronic device 1200. According to an example embodiment, the nonconductive area 132 may be disposed on a position for covering at least one antenna (not shown). According to an example embodiment, the nonconductive area 132 may include a first nonconductive area 1321 disposed in the proximity of the first frame 1210-31, and the first nonconductive area 1321 may cover at least a portion of at least one antenna coupled to the first PCB (for example, 1310 of FIG. 13) or the second cover (for example, 1310-2 of FIG. 13). According to an example embodiment, the nonconductive area 132 may include a second nonconductive area 1322 disposed in the proximity of the second frame 1210-32, and the second nonconductive area 1322 may cover at least a portion of at least one antenna coupled to the second PCB (for example, 320 of FIG. 13) or the second cover (for example, 1210-2 of FIG. 13). The first nonconductive area 1321 or the second nonconductive area 1322 may enhance emission of at least one antenna.

According to an example embodiment, the first nonconductive member 1241 and the second nonconductive member 1242 may be portions that are coupled to the first nonconductive area 1321 or extended from the first nonconductive area 1321. The b metal frame 1210-31b may be isolated from peripheral metal portions of the support structure 1300 by the first nonconductive member 1241, the second nonconductive member 1242, and the first nonconductive area 1321. If the b metal frame 1210-31b is designed to be isolated from the peripheral metal portions, interference by the support structure 1300 (or the side surface bezel structure 1210-3) in the emission of at least one antenna can be enhanced. According to an example embodiment, the second ground (for example, 31002 of FIG. 3) of the second PCB 1320 may be electrically connected to the b metal frame 1210-31b, and the ground may be extended.

Referring to FIG. 15, in an example embodiment, the third nonconductive member 1243 and the fourth nonconductive member 1244 may be portions that are coupled to the second nonconductive area 1322 or extended from the second nonconductive area 1322. The e metal frame 1210-32e may be isolated from peripheral metal portions of the support structure 1300 by the third nonconductive member 1243, the fourth nonconductive member 1244, and the second nonconductive area 1322. If the e metal frame 1210-31e is designed to be isolated from the peripheral metal portions, interference by the support structure 1300 (or the side surface bezel structure 1210-3) in the emission of at least one antenna can be enhanced. According to an example embodiment, the second ground (for example, 31002 of FIG. 3) of the second PCB 1320 may be electrically connected to the e metal frame 1210-32e, and the ground may be extended.

According to various example embodiments, the b metal frame 1210-31b or the e metal frame 1210-32e may be designed as a portion of an antenna (for example, an antenna emitter or an antenna ground). For example, the b metal frame 1210-31b or the e metal frame 1210-32e may be electrically connected to a wireless communication circuit (for example, the communication module 220 of FIG. 2) mounted in the PCB (for example, the first PCB 1310 or the second PCB 1320 of FIG. 13). According to various example embodiments, when the support structure 1300 and the PCB 1310, 1320 are coupled to each other, a portion of the b metal frame 1210-31b or the e metal frame 1210-32e of the support structure 1300 or at least one contact extended therefrom may be electrically connected to at least one contact of the PCB 1310, 1320. At least one contact of the PCB 1310, 1320 may be electrically connected to a communication circuit, at least one antenna, or a ground for an antenna.

Referring to FIG. 5, in various example embodiment, at least a portion of the conductive area 131 of the mounting plate 1210-4 may be formed of the same conductive material as or different conductive material (for example, magnesium (Mg), aluminum (Al), etc.) from that of the metal frame 1210-31a, 1210-31b, 1210-31c, 1210-31e, 1210-31f, 1210-33, or 1210-34 of the support structure 1300.

FIG. 16 is a diagram illustrating the substrate having the grounds with different potentials and the support structure 1300 mounted in the electronic device 1200 including the substrate. Referring to FIGS. 13, 15, and 16, the electronic device 1200 may include the battery 1340 coupled to the third installation portion 1303 of the support structure 1300. According to an example embodiment, the third installation portion 1303 may be substantially rectangular when viewed in the $12^{th}$ direction 40021, and the battery 1340 may have a rectangular plate shape to be fitted into the third installation portion 1303.

Referring to FIGS. 13, 15, and 16, the electronic device 1200 may include the first PCB 1310 coupled to the first installation portion 1301 of the support structure 1300. According to various example embodiments, at least a portion of the various elements of FIG. 2 (for example, the one or more processors (for example, an AP) 210, the communication module 220, the subscriber identification module 224, the memory 230, the sensor module 240, the input device 250, the display 260, the interface 270, the audio module 280, the camera module 291, the power management module 295, the battery 296, the indicator 297, the motor 298, etc.) may be mounted on the first PCB 1310 or may be electrically connected to the first PCB 1310. For example, the first PCB 1310 may include a processor 1311 (for example, a central processing unit (CPU), 120 of FIG. 1 or 210 of FIG. 2). According to an example embodiment, the processor 1311 may be mounted on a 1-2 PCB part 13102 of the first PCB 1310. According to an example embodiment, at least one IC 1312 (for example, a PMIC) associated with power may be mounted on various positions of the first PCB 1310.

According to an example embodiment, the first PCB 1310 may include a 1-1 PCB part 13101 coupled to the 1-1 installation portion 13011 of the first installation portion 1301, and the 1-2 PCB part 13102 coupled to the 1-2 installation portion 13012 of the first installation portion 1301. For example, the first PCB 1310 may have a substantially "T" shape.

Referring to FIGS. 13, 15, and 16, the electronic device 1200 may include the second PCB 1320 coupled to the second installation portion 1302 of the support structure 1300. According to various example embodiments, at least a portion of the various elements of FIG. 2 (for example, the one or more processors (for example, an AP) 210, the communication module 220, the subscriber identification module 224, the memory 230, the sensor module 240, the input device 250, the display 260, the interface 270, the audio module 280, the camera module 291, the power management module 295, the battery 296, the indicator 297, the motor 298, etc.) may be mounted on the second PCB 1320 or may be electrically connected to the second PCB 1320.

According to an example embodiment, the second PCB 1320 may include a 2-1 PCB part 13201 coupled to the 2-1 installation portion 13021 of the second installation portion 1302, and a 2-2 PCB part 13202 coupled to the 2-2 PCB installation portion 13022 of the second PCB installation portion 1302. For example, the second PCB 1320 may have a substantially "L" shape.

An end of the 2-1 PCB part 13102 of the first PCB 1310 may be electrically connected to an end of the 2-2 PCB part 13202 of the second PCB 1320. According to an example embodiment, an end 131021 of the 2-1 PCB part 13102 of the first PCB 1310 may include a first connector (for example, a female connector or a socket connector), and an end 132021 of the 2-2 PCB part 13202 of the second PCB 1320 may include a second connector (for example, a male connector or a header connector).

According to various example embodiments, at least a portion of the 2-2 PCB part 13202 of the second PCB 1320 may be designed to have flexibility. For example, the 2-2 PCB part 13202 may include an FPCB.

According to various example embodiments, the second PCB 1320 may include at least a portion of the PCB 300 of FIG. 3.

Figure 17:
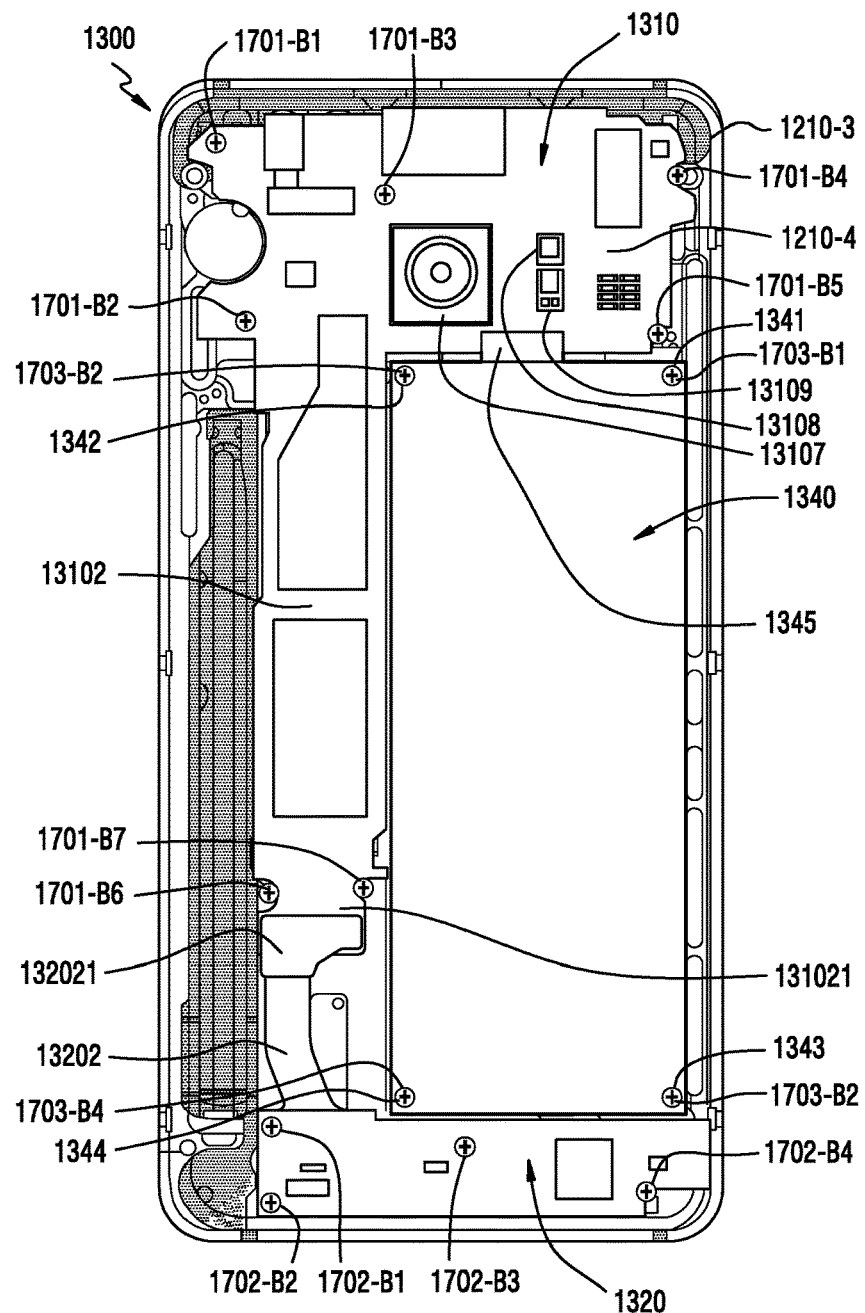
FIG. 17 is a diagram illustrating a first PCB, a second PCB, and a battery which are coupled to the support structure according to an example embodiment.

FIG. 17 is a diagram illustrating the first PCB 1310, the second PCB 1320, and the battery 1340 which are coupled to the support structure 1300 according to an example embodiment. Referring to FIG. 17, the battery 1340 may be coupled to the third installation portion (for example, 1303 of FIG. 16) by using a bolt. According to an example embodiment, the battery 1340 may include bolt screwing holes 1341, 1342, 1343, 1344 formed at four corners thereof. The third installation portion (for example, 1303 of FIG. 16) of the mounting plate 1210-4 may include bosses (for example, a metal or nonmetal cluster including a female screw) (not shown) corresponding to the bolt screwing holes of the battery 1340. The battery 1340 may be coupled to the third installation portion 1303 by allowing a plurality of bolts 1703-B1, 1703-B2, 1703-B3, 1703-B4 to pass through the bolt screwing holes 1341, 1342, 1343, 1344 of the battery 1340, and then screwing the bolts into the bosses of the third installation portion (for example, 1303 of FIG. 16). The battery 1340 may be coupled to the third installation portion (for example, 1303 of FIG. 16) by using various other coupling means, although they are not illustrated. For example, the battery 1340 and the third installation portion 1303 may be coupled to each other by using an adhering means such as a double-sided tape, an adhesive, etc.

Referring to FIG. 17, in an example embodiment, the battery 1340 may include an extension portion 1345 protruding to one side therefrom. The extension portion 1345 may include at least one contact. When the battery 1340 is coupled to the support structure 1300, the extension portion 1345 of the battery 1340 may cover a portion of the first PCB 1310, and at least one contact of the extension portion 1345 may be electrically connected with a contact (not shown) of the first PCB 1310. According to various example embodiments, the electronic device 1200 may include a conductive connection member (or a flexible conductive member) (for example, a pogo pin, a C clip, etc.) disposed between the contact of the first PCB 1310 and at least one contact of the extension portion 1345 of the battery 1340, and having elasticity.

Referring to FIG. 17, the first PCB 1310 may be coupled to the first installation portion (for example, 1301 of FIG. 16) by using a bolt. According to an example embodiment, the first PCB 1310 may include a plurality of bolt screwing holes (not shown). The first installation portion (for example, 1301 of FIG. 16) of the mounting plate 1210-4 may include bosses (not shown) (for example, a metal or nonmetal cluster including a female screw) corresponding to the bolt screwing holes of the first PCB 1310. The first PCB 1310 may be coupled to the first installation portion (for example, 1301 of FIG. 16) by allowing the plurality of bolts 1701-B1, 1701-B2, 1701-B3, 1701-B4, 1701-B5, 1701-B6, 1701-B7 to pass through the bolt screwing holes of the first PCB 1310, and then screwing the bolts into the bosses of the first installation portion (for example, 1301 of FIG. 16). Positions of the bolt screwing holes of the first PCB 1310 may be designed to allow the first PCB 1310 to be coupled to the first installation portion (for example, 1301 of FIG. 16) without loosening at least a portion of the first PCB 1310. The first PCB 1310 may be coupled to the first installation portion (for example, 1301 of FIG. 16) by using various other coupling means (for example, a double-sided tape, etc.), although they are not illustrated.

Referring to FIG. 17, the second PCB 1320 may be coupled to the second installation portion (for example, 1302 of FIG. 16) by using a bolt. According to an example embodiment, the second PCB 1320 may include a plurality of bolt screwing holes (not shown). The second installation portion (for example, 1302 of FIG. 16) of the mounting plate 1210-4 may include bosses (not shown) corresponding to the bolt screwing holes of the second PCB 1320. The 2-1 PCB part 13201 of the second PCB 1320 may be coupled to the second installation portion (for example, 1302 of FIG. 16) by allowing the plurality of bolts 1702-B1, 1702-B2, 1702-B3, 1702-B4 to pass through the bolt screwing holes of the second PCB 1320, and then screwing the bolts into the bosses of the second installation portion (for example, 1302 of FIG. 16). Positions of the bolt screwing holes of the second PCB 1320 may be designed to allow the 2-1 PCB part 13201 of the second PCB 1320 to be coupled to the second installation portion (for example, 1302 of FIG. 16) without loosening at least a portion of the 2-1 PCB part 13201 of the second PCB 1320.

The second PCB 1320 may be electrically connected to the first PCB 1310. According to an example embodiment, the 2-2 PCB part 13202 of the second PCB 1320 may be an FPCB having a second connector (for example, a male connector or a header connector) disposed at one end 132021 thereof. The 2-1 PCB part 13102 of the first PCB 1310 may include a first connector (for example, a female connector or a socket connector) disposed at one end 131021 thereof. The second connector of the 2-2 PCB part 13202 may be electrically connected to the connector of the 2-1 PCB part 13102.

Referring to FIG. 13, the electronic device 1200 may include an external port 13210 (for example, the USB 274 of FIG. 2 or the connector 320 of FIG. 3) mounted on the second PCB 1320. The external port 13210 may be disposed between the second PCB 1320 and the second cover 1210. Referring to FIGS. 12A, 12B, and 13, the second frame 210-32 may include a penetrating hole 13004 for the external port 13210.

An external device may be electrically connected to the external port 13210 through the penetrating hole 13004, and the electronic device 1200 may exchange signals or data with the external device. According to an example embodiment, the second PCB 1320 may include a first ground (not shown) with the same potential as that of the external port 13210, and a second ground (not shown) having a different potential from that of the first ground and physically isolated from the first ground. According to various example embodiments, the first ground and the second ground may be similar to or the same as the first ground 41001 and the second ground 41002 of FIG. 4, respectively, and a detailed description thereof is omitted.

According to an example embodiment, the electronic device 1200 may include a ground extension member 13300 disposed between the support structure 1300 and the second PCB 1320 and electrically connected with the second ground. The ground extension portion 1300 may be similar to or the same as the ground extension member 330 of the PCB 300 of FIG. 3, and a detailed description thereof is omitted.

According to an example embodiment, the electronic device 1200 may include a conductive connection member 13400 disposed between the ground extension member 13300 and the support structure 1300 to electrically connect the ground extension member 13300 and the support structure 1300 (for example, the conductive area 131 of FIG. 15). The conductive connection member 13400 may be similar to or the same as the conductive connection member 330 of FIG. 3, and a detailed description thereof is omitted.

Referring to FIGS. 13, 16, and 17, in an example embodiment, when the second PCB 1320 is coupled to the second installation portion 1302 of the support structure 1300, the second ground (for example, 31002 of FIG. 3) of the second PCB 1320 may be electrically connected to the conductive area 131 of the support structure 1300 through the ground extension member 13300 and the conductive connection member 13400. According to an example embodiment, when signals or data are exchanged with an external device through the external port 13210, a noise occurring in the external port 13210 may be distributed to the first ground (for example, 31001 of FIG. 3), the ground extension member 13300, the second ground (for example, 31002 of FIG. 3), the conductive connection member 13400, or the conductive area 131 of the support structure 1300, and may be reduced, and this may enhance an electric influence by the connector effectively. For example, a relatively high noise floor from among the noises occurring at the external port 13210 may be reduced by the ground extension member 13300, the second ground (for example, 31002 of FIG. 3), the conductive connection member 13400, or the conductive area 131 of the support structure 1300.

According to an example embodiment, an external device may be connected to the external port 13210, and the second PCB 1320 may receive power from the external device. At least one IC (for example, a power management module (for example, 295 of FIG. 2) (for example, a PMIC or a charger IC) (for example, 1312 of FIG. 13) related to power of the electronic device 1200 may charge the battery 1340 by using power received through the external port 13210.

According to an example embodiment, the external device may receive an AC from an AC power source, and may rectify the AC to a DC of a relatively low low-voltage. If the external device has a defect, the AC of the high voltage supplied from the AC power source may not be rectified to the DC of the low voltage, and may be drawn in the second PCB 1320 through the external port 13210. When the AC is drawn in the second PCB 1320 through the external port 13210, the PCB (for example, the first PCB 1310 or the second PCB 1320) or at least one electronic component mounted on the PCB may be broken down. The AC drawn in through the external port 13210 may flow to at least one conductive portion (for example, the conductive area 131 of the mounting plate 1310-4 of FIG. 15, or the size surface bezel structure 1210-3) of the support structure 1300 through the second PCB 1320, and this may cause an electric shock to a user carrying the electronic device. According to an example embodiment, the second PCB 1320 may include at least one element (for example, an active element) (not shown) electrically connected with the second ground (for example, 31002 of FIG. 3). For example, the at least one element may include a capacitor or a diode (for example, a transient voltage suppressor (TVS) diode, etc.). According to an example embodiment, the at least one element (for example, a capacitor) of the second PCB 1320 may convert the AC or an over current drawn in through the external port 13210 to a DC of a relatively low low-voltage. The converted DC may flow to the conductive portion of the support structure 1300 of the electronic device 1200 through the second ground, the ground extension member 13300, and the conductive connection member 13400, and this can prevent an electric shock caused by the AC or over current drawn in through the external port 13210. According to various example embodiments, at least one element of the second PCB 1320 may block the AC or over current drawn in through the external port 13210, and this can prevent an electric shock to the user caused by the AC or over current drawn in through the external port 13210.

Referring to FIG. 13, the second cover 1310-2 may be coupled to the bezel lower edge 1210-36 of the support structure 1300, and a space for mounting electronic components (for example, the PCB 1310, 1320, the battery 1340, etc.) may be formed between the second cover 1210-2 and the support structure 1300.

The second cover 1210-2 may include penetrating holes (or light transmitting areas) 1220-27, 1220-28. Referring to FIGS. 12B and 17, a camera 13107 (or rear facing camera) or a flash 13108 may be mounted on the first PCB 310 (or the 1-1 PCB part 13101). An optical sensor 13109 (for example, a heartbeat measurement sensor) including a light emitter and a light receiver may be mounted on the first PCB 1310. According to an example embodiment, the camera 13107 may be aligned with one penetrating hole 1210-27 of the second cover 1210-2, and may be coupled to the penetrating hole 1210-27. The flash 13108 and the optical sensor 13109 may be aligned with another penetrating hole 1210-28 of the second cover 1210-2, and may be coupled to the penetrating hole 1210-28.

According to various example embodiments, the second cover 1210-2 may include at least one antenna (not shown). According to an example embodiment, the at least one antenna may include a conductive pattern extended from one end to the other end and including winding portions formed of a plurality of turns. The second cover 1210-2 may include an antenna first contact disposed at one end of the at least one antenna or in the proximity thereof, and an antenna second contact disposed at the other end of the at least one antenna or in the proximity thereof. When the second cover 1210-2 is coupled to the electronic device 1200, the antenna first contact and the antenna second contact may be electrically connected to the contacts of the first PCB 1310 or the second PCB 1320. According to various example embodiments, the contacts of the first PCB 1310 or the second PCB 1320 may include a connection member having elasticity, such as a C clip, a pogo-pin, a spring, conductive phorone and rubber, a conductive tape, a copper connector, etc.

According to various example embodiments, the at least one antenna is not limited to the structure of being coupled to the second cover 1310-2, and may be designed in various other structures, although they are not illustrated. For example, the at least one antenna may be designed to be coupled to or included in the PCB (for example, the first PCB 1310 or the second PCB 1320 of FIG. 13) (or a non-ground area of the PCB). In another example, the at least one antenna may be designed to be coupled to or included in the support structure 1300 (or a nonconductive area (for example, 132 of FIG. 15)). In another example, the at least one antenna may be designed to be coupled to or included in the battery 1340. The at least one antenna may be included in the electronic device 1200 in various other structures.

According to various example embodiments, referring to FIG. 15, the at least one antenna may be substantially designed on a position aligned with the first nonconductive area 1321 or the second nonconductive area 1322 of the support structure 1300. According to an example embodiment, the at least one antenna of the second cover 1210-2 may be electrically connected to a wireless charging circuit (not shown) mounted on the first PCB 1310 or the second PCB 1320. The wireless charging circuit may support, for example, a magnetic resonance method, a magnetic induction method, or an electromagnetic wave method.

According to various example embodiments, the at least one antenna of the second cover 1210-2 may be electrically connected to a communication circuit (for example, the communication module 220 of FIG. 2) supporting wireless communication in various forms. According to various example embodiments, the communication module (for example, 220 of FIG. 2) may be mounted on the first PCB 1310 or the second PCB 1320.

A wireless communication device including a communication module and at least one antenna may be influenced by a noise occurring at the external port 13210 (for example, the connector 320 of FIG. 3). According to an example embodiment, when signals or data is exchanged with an external device through the external port 13210, the noise occurring at the external port 13210 may be moved to the conductive area 121 or the bezel 1310-3 of the support structure 1300 through the ground extension member 13300 and the conductive connection member 13400, and this can prevent degradation of performance (for example, performance of an antenna) of the wireless communication device caused by the noise occurring at the external port 13210.

FIG. 18A is a table illustrating values regarding communication performance of an electronic device (for example, 1200 of FIG. 12A) including a substrate having grounds with different potentials according to an example embodiment. FIG. 18B is a table representing values regarding communication performance of an electronic device including a substrate that does not have grounds with different potentials. The electronic device related to FIG. 18B is merely an electronic device that omits a second ground (for example, 31002 of FIG. 3) and elements related thereto to be compared with the electronic device 1200 according to an example embodiment in the same experiment condition, and cannot be regarded as a normal electronic device.

Referring to FIG. 18A, when signals or data are not exchanged with an external device through the external port 13210 (for example, when signals or data are not transmitted to or is not received from an external device), communication performance (for example, a receive sensitivity) of the electronic device 1200 in a first band 1801 (for example, LTE B4 (uplink 1710-1755 MHz, downlink 2110-2115 MHz)) may have a value of −94.7 dBm. When signals or data are exchanged with an external device through the external port 13210, communication performance of the electronic device 1200 in the first band 1801 may have a value of −88.9 dBm. In the first band 1801, a difference (delta) between the communication performance value when signals or data are not exchanged with the external device through the external port 13210 and the communication performance value when signals or data are exchanged with the external device through the external port 13210 may be −5.8.

Referring to FIG. 18B, when signals or data are not exchanged with an external device through an external port, communication performance (for example, a receive sensitivity) of the electronic device in the first band 1801 (for example, LTE B4 (uplink 1710-1755 MHz, downlink 2110-2115 MHz)) may have a value of −94.1 dBm. When signals or data are exchanged with an external device through the external port, communication performance of the electronic device in the first band 1801 may have a value of −80.8 dBm. In the first band 1801, a difference (delta) between the communication performance value when signals or data are not exchanged with the external device through the external port and the communication performance value when signals or data are exchanged with the external device through the external port may be −13.2.

In the first band 1801, the communication performance of the electronic device (for example, 1200 of FIG. 12A) related to FIG. 18A may not be degraded even when signals or data are exchanged with the external device through the external port, in comparison to the electronic device related to FIG. 18B.

Referring to FIG. 18A, when signals or data are not exchanged with an external device through the external port 13210 (for example, when signals or data are not transmitted to or is not received from an external device), communication performance (for example, a receive sensitivity) of the electronic device 1200 in a second band 1802 (for example, LTE B2 (uplink 1850-1910 MHz, downlink 1930-1990 MHz)) may have a value of −95.4 dBm. When signals or data are exchanged with an external device through the external port 13210, communication performance of the electronic device 1200 in the second band 1802 may have a value of −91.1 dBm. In the second band 1802, a difference (delta) between the communication performance value when signals or data are not exchanged with the external device through the external port 13210 and the communication performance value when signals or data are exchanged with the external device through the external port 13210 may be −4.3.

Referring to FIG. 18B, when signals or data are not exchanged with an external device through the external port, communication performance (for example, a receive sensitivity) of the electronic device in the second band 1802 (for example, LTE B2 (uplink 1850-1910 MHz, downlink 1930-1990 MHz)) may have a value of −96.1 dBm. When signals or data are exchanged with an external device through the external port, communication performance of the electronic device in the second band 1802 may have a value of −88.3 dBm. In the second band 1802, a difference (delta) between the communication performance value when signals or data are not exchanged with the external device through the external port and the communication performance value when signals or data are exchanged with the external device through the external port may be −7.8.

In the second band 1802, the communication performance of the electronic device (for example, 1200 of FIG. 12A) related to FIG. 18A may not be degraded even when signals or data are exchanged with the external device through the external port, in comparison to the electronic device related to FIG. 18B.

Referring to FIGS. 12A to 13, the electronic device 1200 may include a socket 13220 mounted on the second PCB 1320. The support structure 1300 (or the second frame 1210-32) may include a penetrating hole 13042 formed on a position aligned with the socket 13220. For example, a plug (for example, an ear jack) of an external device may be connected to the socket 13220 through the penetrating hole 13042.

Referring to FIGS. 12A to 13, the electronic device 1200 may include a speaker or a microphone (not shown) mounted on the second PCB 1320. The support structure 1300 (or the second frame 1210-32) may include penetrating holes 13043, 13044 formed on positions aligned with the speaker or the microphone.

According to an example embodiment, when the second cover edge (for example, 1210-26 of FIG. 13) of the second cover 1210-2 is coupled to the bezel lower edge 1210-36 of the support structure 1300, the second cover edge 1210-26 and the bezel lower edge 1210-36 may be in close contact with each other. According to various example embodiments, an adhering means (for example, a double-sided tape) may be interposed between the second cover edge 1210-26 and the bezel lower edge 1210-36. Foreign substances (for example, water or dust) can be prevented from entering the inside of the electronic device 400 through a portion between the second cover edge 1210-26 and the bezel lower edge 1210-36.

According to an example embodiment, an electronic device (for example, 1200 of FIG. 12A) may include: a substrate (for example 310 of FIG. 3); and a connector (for example, 320 of FIG. 3) including a plurality of terminals (for example, a tail 5304 of FIG. 6A) disposed on a first area (for example, the connector installation area 3100 of FIG. 3) of the substrate. The substrate may include: a first layer (for example, the first layer 410 or the second layer of FIG. 4) including signal lines (for example, 490 of FIG. 4) connected to the plurality of terminals and a dielectric substance (for example, the first dielectric substance 411, the second dielectric substance 421, or the third dielectric substance 431 of FIG. 4) between the signal lines. The substrate may include a second layer disposed on the first layer, and including a first ground (for example, 31001 of FIG. 3 or a portion of the fourth layer 440 of FIG. 4) electrically connected with the connector and a second ground (for example, 31002 of FIG. 3 or the other portion of the fourth layer 440 of FIG. 4) physically isolated from the first ground. The substrate may include a third conductive layer (for example, the conductive member 331 of the ground extension member 330 of FIG. 3) disposed on the second layer, and electrically connected with the second ground. The substrate may include a fourth layer (for example, the nonconductive member 332 of the ground extension member 330 of FIG. 3) having a nonconductive material disposed on an area corresponding to the first area between the second layer and the third conductive layer.

According to an example embodiment, the connector (for example, 320 of FIG. 3) may be disposed under or beneath the first layer (for example, the first layer 410 or the second layer 420 of FIG. 4), and may be aligned perpendicular to at least an area of the third conductive third layer (for example, the conductive member 331 of the ground extension member 330 of FIG. 3).

According to an example embodiment, the first ground (for example, 31001 of FIG. 3) may overlap the first area (for example, the connector installation area 3100 of FIG. 3) at least in part.

According to an example embodiment, the second ground (for example, 31002 of FIG. 3) may be disposed on a second area of the substrate isolated from the first area (for example, the connector installation area 3100 of FIG. 3).

According to an example embodiment, a portion of the signal lines (for example, 490 of FIG. 4) may be electrically connected to the first ground (for example, 31001 of FIG. 3).

According to an example embodiment, the first ground (for example, 31001 of FIG. 3) may have a substantially same potential as that of the connector (for example, 320 of FIG. 3), and the second ground (for example, 31002 of FIG. 3) may have a different potential from that of the first ground.

According to an example embodiment, the substrate (for example, 310 of FIG. 3) may include at least one capacitor electrically connected with the second ground (for example, 31002 of FIG. 3).

According to an example embodiment, the electronic device (for example, 1200 of FIG. 13) may include: a first cover (for example, 1210-1 of FIG. 13) forming a first surface facing toward a first direction; a second cover (for example, 1210-2 of FIG. 13) forming a second surface facing toward a second direction opposite the first direction; a bezel (for example, 1210-3 of FIG. 13) surrounding a space between the first cover and the second cover; and a mid-plate (for example, 1210-4 of FIG. 13) extended from the bezel to the space. The substrate may be disposed between the mid-plate and the second cover, and the third conductive layer (for example, the conductive member 331 of the ground extension member 330 of FIG. 3) may be electrically connected to a conductive area (for example, 131 of FIG. 15) included in the mid-plate.

According to an example embodiment, the electronic device (for example, 1200 of FIG. 13) may include a flexible conductive member (for example, the conductive connection member 340 of FIG. 3 or the conductive connection member 13400 of FIG. 13) disposed on the second ground (for example, 31002 of FIG. 3), and disposed between the third conductive layer (for example, the conductive member 331 of the ground extension member 330 of FIG. 3) and the conductive area (for example, 131 of FIG. 15) of the mid-plate.

According to an example embodiment, the flexible conductive member (for example, the conductive connection member 340 of FIG. 3 or the conductive connection member 13400 of FIG. 13) may, for example, and without limitation be one of a C clip, a pogo-pin, a spring, conductive phorone and rubber, a conductive tape, and a copper connector.

According to an example embodiment, the substrate may include: a first substrate (for example, the first PCB 1310 of FIG. 13) coupled to a first area (for example, the first installation portion 1301 of FIG. 16) of the mid-plate (for example, 1210-3 of FIG. 13); and a second substrate (for example, the second PCB 1320 of FIG. 13) coupled to a second area (for example, the second installation portion 1302 of FIG. 16) isolated from the first area of the mid-plate, and electrically connected with the first substrate.

According to an example embodiment, the electronic device (for example, 1200 of FIG. 13) may include a display (for example, 1330 of FIG. 13) disposed between the first cover (for example, 1210-1 of FIG. 13) and the mid-plate (for example, 1210-4 of FIG. 13).

According to an example embodiment, the electronic device (for example, 1200 of FIG. 13) may further include at least one conductive pattern disposed on the second cover (for example, 1210-2 of FIG. 13). The substrate (for example, the first PCB 1310 or the second PCB 1320 of FIG. 13) may include a wireless communication circuit electrically connected with the at least one conductive pattern of the second cover.

According to an example embodiment, the second ground (for example, 31002 of FIG. 3) may be surrounded by the first ground (for example, 31001 of FIG. 3).

According to an example embodiment, the electronic device (for example, 1200 of FIG. 13) may include a third ground (for example, the B ground 31000b of FIG. 3 or the fifth layer 450 of FIG. 4)) disposed under or beneath the first layer (for example, the first layer 410 or the second layer 420 of FIG. 4).

According to an example embodiment, the electronic device (for example, 1200 of FIG. 13) may include a fourth ground (for example, the sixth layer 461 or 462 or the seventh layer 471 or 471 of FIG. 4) coupled to at least a portion of a side surface of the first layer (for example, the first layer 410 or the second layer 420 of FIG. 4).

According to an example embodiment, the electronic device (for example, 1200 of FIG. 3) may include at least one processor (for example, 120 of FIG. 1, 210 of FIG. 2, or 1311 of FIG. 13) mounted on the substrate (for example, 310 of FIG. 4) and electrically connected with the plurality of signal lines (for example, 490 of FIG. 4). The at least one processor may transmit and receive digital data signals to and from an external device connected to the connector (for example, 320 of FIG. 3 or the external port 13210 of FIG. 13).

According to an example embodiment, the at least one processor (for example, 120 of FIG. 1, 210 of FIG. 2, or 1311 of FIG. 13) may transmit and receive the digital data signals by using a protocol of a USB 3.0 or a higher version thereof.

According to an example embodiment, the electronic device (for example, 1200 of FIG. 13) may include at least one IC mounted on the substrate (for example, 310 of FIG. 3 or 4) and electrically connected with the plurality of signal lines (for example, 490 of FIG. 4) regarding power supply.

According to an example embodiment, the connector (for example, 320 of FIG. 3 or the external portion 13210 of FIG. 13) may be a C type connector.

The present disclosure has been described with reference to various example embodiments thereof. It will be understood by a person skilled in the art that the present disclosure can be implemented in modified forms without departing from the essential characteristics of the present disclosure. Therefore, disclosed embodiments should be considered from a descriptive perspective, not from a limited perspective. The scope of the present disclosure is defined not by the detailed description but by the appended claims, and all differences within the scope should be understood as being included in the present disclosure.

What is claimed is:

1. An electronic device comprising:
   a substrate comprising:
      a first layer comprising signal lines and dielectric material disposed between the signal lines; and
      a second layer disposed on the first layer, and comprising a first ground, and a second ground physically isolated from the first ground when viewed from above the substrate;
   a connector disposed on the substrate, and electrically connected to the signal lines and the first ground;
   a conductive layer disposed on the second layer, wherein, when viewed from above the conductive layer, the conductive layer at least partially overlaps both the connector and the second ground;
   a nonconductive adhesive layer disposed between the second layer and the conductive layer to physically isolate the conductive layer and the second layer; and
   a conductive adhesive material disposed between the conductive layer and the second ground to electrically connect the conductive layer and the second ground.

2. The electronic device of claim 1, wherein the first layer is disposed between the connector and the second layer.

3. The electronic device of claim 1, wherein, when viewed from above the substrate, the first ground at least partially overlaps the connector.

4. The electronic device of claim 1, wherein, when viewed from above the substrate, the second ground does not overlap the connector.

5. The electronic device of claim 1, wherein, when viewed from above the conductive layer, a portion of the conductive layer overlaps the first ground.

6. The electronic device of claim 1, wherein the first ground has a substantially same potential as a potential of a ground of the connector, and
   wherein the second ground has a different potential from a potential of the first ground.

7. The electronic device of claim 1, wherein the substrate comprises at least one capacitor electrically connected with the second ground.

8. The electronic device of claim 1, further comprising:
   a first cover forming a first surface of the electronic device and facing a first direction;
   a second cover forming a second surface of the electronic device and facing a second direction opposite the first direction;
   a bezel surrounding a space between the first cover and the second cover; and
   a mid-plate extending from the bezel to the space,
   wherein the substrate is disposed between the mid-plate and the second cover, and
   wherein the third conductive layer is electrically connected to a conductive area of the mid-plate.

9. The electronic device of claim 8, further comprising a flexible conductive member disposed on the second ground and disposed between the conductive layer and the conductive area of the mid-plate.

10. The electronic device of claim 9, wherein the flexible conductive member includes one of: a C clip, a pogo-pin, a spring, conductive phorone and rubber, a conductive tape, and a copper connector.

11. The electronic device of claim 8, wherein the substrate comprises:
　a first substrate coupled to a first area of the mid-plate; and
　a second substrate coupled to a second area of the mid-plate isolated from the first area of the mid-plate, and electrically connected with the first substrate.

12. The electronic device of claim 8, further comprising a display disposed between the first cover and the mid-plate.

13. The electronic device of claim 8, further comprising at least one conductive pattern disposed on the second cover,
　wherein the substrate further comprises a wireless communication circuit electrically connected with the at least one conductive pattern of the second cover.

14. The electronic device of claim 1, wherein the second ground is surrounded by the first ground.

15. The electronic device of claim 1, further comprising a third layer comprising a third ground on the first layer, wherein the first layer is disposed between the second layer and the third layer.

16. The electronic device of claim 1, further comprising a fourth ground coupled to at least a portion of a side surface of the first layer.

17. The electronic device of claim 1, further comprising at least one processor mounted on the substrate and electrically connected with the plurality of signal lines, and
　wherein the at least one processor is configured to transmit and receive digital data signals to and from an external device connected to the connector.

18. The electronic device of claim 17, wherein the at least one processor is configured to transmit and receive the digital data signals using a protocol of a USB 3.0 standard or a higher version thereof.

19. The electronic device of claim 1, further comprising at least one IC mounted on the substrate and electrically connected with the plurality of signal lines regarding power supply.

20. The electronic device of claim 1, wherein the connector is a C type connector.

* * * * *